United States Patent [19]

Koike et al.

[11] Patent Number: 5,610,852

[45] Date of Patent: Mar. 11, 1997

[54] FERROELECTRIC MEMORY AND METHOD FOR CONTROLLING OPERATION OF THE SAME

[75] Inventors: Hiroki Koike; Tohru Kimura; Tetsuya Otsuki; Masahide Takada, all of Tokyo, Japan

[73] Assignee: NEC Corporation, Tokyo, Japan

[21] Appl. No.: 582,619

[22] Filed: Jan. 4, 1996

[30] Foreign Application Priority Data

Jan. 4, 1995 [JP] Japan ................................. 7-000063

[51] Int. Cl.$^6$ .................................................. G11C 11/22
[52] U.S. Cl. ................................... 365/145; 365/206
[58] Field of Search .................................... 365/145, 206, 365/208, 149, 190

[56] References Cited

U.S. PATENT DOCUMENTS

| | | | |
|---|---|---|---|
| 4,873,664 | 10/1989 | Eaton, Jr. ................. | 365/145 |
| 5,309,391 | 5/1994 | Papaliolios ............... | 365/145 |
| 5,357,460 | 10/1994 | Yusuki et al. ............ | 365/145 |
| 5,455,786 | 10/1995 | Takeuchi et al. ........ | 365/145 |
| 5,515,312 | 5/1996 | Nakakuma et al. ..... | 365/145 |
| 5,517,445 | 5/1996 | Imai et al. ............... | 365/208 |

FOREIGN PATENT DOCUMENTS 63-201998  8/1988  Japan.

OTHER PUBLICATIONS

Eaton, Jr. et al. Non–Volatile Memories Feb. 18, 1988 –IEEE International Solid–State Circuits Conference pp. 130–131.

*Primary Examiner*—Tan T. Nguyen
*Attorney, Agent, or Firm*—Sughrue, Mion, Zinn, Macpeak & Seas

[57] ABSTRACT

In a ferroelectric memory, when data is read out from a memory cell, a variation absorbing circuit minimizes a variation of the voltage on the pair of data signal lines caused by factor other than the current caused due to the polarization of the ferroelectric capacitor. Thus, a voltage not smaller than the coercive voltage can be applied between the opposing electrodes of the ferroelectric capacitor, with the result that a sufficient read-out signal voltage can be obtained.

38 Claims, 32 Drawing Sheets

FERROELECTRIC MEMORY AND METHOD FOR CONTROLLING OPERATION OF THE SAME

BACKGROUND OF THE INVENTION

1. Field of the Invention

The present invention relates to a ferroelectric memory and a method for controlling an operation thereof.

2. Description of Related Art

Recently, a non-volatile memory including memory cells composed of a ferroelectric material such as lead zirconate titanate (PZT) having a hysteresis characteristics so that even if a power supply is shut down, a stored content is held. Some examples of this type memory have been reported in Japanese Patent Application Laid-open Publication No. JP-A-63-201998 (which corresponds to U.S. Pat. No. 4,873,664), 1988 IEEE International Solid-State Circuits Conference (ISSCC), Feb. 18, 1988, Digest of Technical Papers, pages 130–131, and 1994 IEEE International Solid-State Circuits Conference (ISSCC), Feb. 18, 1994, Digest of Technical Papers, pages 268–269, the disclosure of which is incorporated by reference in its entirety into this application.

Now, based on these reports, a circuit construction and an operation of the conventional non-volatile ferroelectric memory will be described.

Referring to FIG. 1, there is shown a circuit of ferroelectric memory cell, which is disclosed in JP-A-63-201998 and in which one memory cell is constituted of two transistors and two capacitors (called a "2T/2C type" hereinafter). In FIG. 1, Reference Numeral 11 designates a memory cell selection signal line (called simple "selection signal line" hereinafter), and Reference Numeral 13 shows a plate line. Reference Numerals 12 and /12 indicate a pair of complementary signal lines, and Reference Numeral 101 designates a memory cell. Here, in this specification, "/" put just before Reference Numeral such as "12" indicates an upper bar given to the just succeeding Reference Numeral, and means to take a condition ceaseless complementary to the condition of one given with the same Reference Numeral without "/". Reference Numerals 102 and 103 show switching transistors of the memory cell, and Reference Numerals 104 and 105 indicate ferroelectric capacitors.

In the 2T/2C type memory cell as mentioned above, data is written into the ferroelectric capacitors 104 and 105 in such a manner that the ferroelectric capacitors 104 and 105 always have polarization directions opposite to each other. Electric charges from the ferroelectric capacitors 104 and 105 always have polarization directions opposite to each other, are read out to the pair of data signal lines 12 and /12, so that a voltage difference is generated between the pair of data signal lines, and amplified by a sense amplifier which is composed of a differential amplifier circuit.

Referring to FIG. 2, there is shown a mode of the hysteresis characteristics of the ferroelectric capacitors 104 and 105, which indicates a relation between a spontaneous polarization electric charge Q and a voltage V between opposing electrodes of the ferroelectric capacitor. For example, it is considered that when the ferroelectric capacitors 104 and 105 are polarized in conditions A and B, respectively, data "1" is stored, and when the ferroelectric capacitors 104 and 105 are polarized in conditions B and A, respectively, data "0" is stored. At this time, when a voltage of Ve is applied between the opposing electrodes of each ferroelectric capacitor, if the data "1" is stored, an electric charge "Q1" is outputted from the capacitor 104 to the data signal line 12 and an electric charge "Q0 is outputted from the capacitor 105 to the data signal line /12. These electric charges will generate a voltage difference between the pair of data signal lines, as mentioned above.

In the above mentioned memory using the ferroelectric capacitor, even if an external voltage applied between the opposing electrodes of each ferroelectric capacitor becomes zero, since the spontaneous polarization internally occurring in the ferroelectric material maintains the data, the data is held after the electric supply is shut down. In other words, so called non-volatile memory operation is realized.

Referring to FIG. 3, there is shown a partial circuit of a memory cell array in a ferroelectric memory using the memory cell of the type shown in FIG. 1. In FIG. 3, Reference Numerals 11A to 11C designate a selection signal line, and Reference Numerals 12A and /12A and 12B and /12B show a data signal line. Reference Numerals 13A to 13C indicate a plate line, and Reference Numeral 14 designates a date signal line precharge control line. Reference Numeral 15 shows a data signal line precharge voltage line, and Reference Numeral 16 indicates a sense amplifier control line. Reference Numerals 101A to 101F designate a memory cell. Reference Numerals 102A and 103A show a switching transistor of the memory cell, and Reference Numerals 104A and 105A indicate a ferroelectric capacitor of the memory cell. Reference Numerals 106A and 106B designate a data signal line precharge circuit, and Reference Numerals 107A and 107B show a sense amplifier.

Now, a reading operation and a writing operation of the memory cell 101A in the ferroelectric memory will be described with reference to FIG. 3 and FIG. 4 which is a timing chart illustrating an operation of the memory cell shown in FIG. 3. Incidentally, in this specification, unless specially indicated, a logical "high level" correspond to a power supply voltage applied from an device external to the memory, or a voltage generated in an internal voltage generating circuit of the memory, and a logical "low level" is a ground level. Accordingly, these voltages can take various values, for example, 5 V, 3 V, etc., dependently upon the case. Furthermore, for reference, the polarized condition of each of the ferroelectric capacitors 104A and 105A at an end of each of periods (1) to (6) in FIG. 4 is shown below the timing chart in FIG. 4.

In FIG. 4, the periods (1) to (3) shows the operation of reading out data from the memory cell. In the period (1), the data signal line precharge control signal 14 is brought to the low level, so at to cancel the precharge condition of the data signal line. Here, the data signal line precharge level is the ground level.

In the next period (2), the selection signal line 11A and the plate line 13A are brought to the high level, so that data is caused to be outputted from the memory cell 101A to the data signal lines 12A and /12A. The data outputted at this time, is determined by the internal polarization condition of the ferroelectric capacitor. The example shown in FIG. 4 shows the reading of the data "1", as will be seen from the explanation made hereinbefore.

In the succeeding period (3), the sense amplifier control line 16 is activated, so that the voltage difference between the pair of data signal line 12A and /12A is sense-amplified.

The periods (4) to (6) illustrate the operation of re-writing the read-out data to the memory cell. At the time of the period (2), since the data of the read-out memory cell is destroyed, this re-writing is necessary. Incidentally, in the case of writing the memory cell with data supplied from a device external to the memory, it is necessary to set a pair of voltages corresponding to a desired data to be written, onto the pair of data signal lines 12A and /12A during the period (3), before the operation of the succeeding periods (4) to (6) is performed.

During the period (4), the plate line 13A is brought to the low level. In the next period (5), the sense amplifier control signal line 16 is brought to the low level, so as to deactivate the sense amplifier, and furthermore, the precharge control signal line 14 is brought to the high level and the data signal lines are brought to the ground level. With this arrangement, the polarization of the capacitors is returned to the condition of the period (1) before the data reading. Finally, during the period (6), the selection signal line 11A is brought to the low level, so as to render the memory cell transistors (switching transistors) non-conductive. Thus, the access to the memory cell is completed.

Here, a relation between the above mentioned circuit operation and the characteristics of the ferroelectric capacitor will be discussed. For example, the condition of the period (2) of FIG. 4 in which the selection signal line 11A is brought to the high level so as to turn on the switching transistors 102A and 103A and the plate line 13A is brought to the high level, corresponds to the condition in which the voltage of −Ve is applied to the ferroelectric capacitor (assuming that a direction from the plate line to the data signal line is positive in voltage). At this time, the electric charge Q1 or Q0 is outputted to the data signal line 12A. However, regardless of which of the "1" and "0" is stored, the polarization of the ferroelectric capacitor in this condition is at a point "h" as shown in FIG. 2, and therefore, it is not possible to discriminate "1" or "0". Therefore, it is necessary to re-write the data by applying the voltage +Ve or 0 dependently upon the read-out data "1" or "0", to the ferroelectric capacitor. This operation corresponds to the operation during the periods (4) and (5) in FIG. 4.

As mentioned above, in order to realize the non-volatile memory operation by using the ferroelectric memory cell, it is necessary to apply both positive and negative voltages between the opposing electrodes of the ferroelectric capacitor.

In order to realize a high density of memory, there is a memory cell composed of one transistor and one ferroelectric capacitor (called a "1T/1C type" hereinafter). This type of ferroelectric memory cell is reported in 1994 IEEE International Solid-State Circuits Conference (ISSCC), Feb. 18, 1994, Digest of Technical Papers, pages 268–269.

Referring to FIG. 5, one example of the 1T/1C type of ferroelectric memory cell. In FIG. 5, Reference Numeral 11 designates a memory cell selection signal line, and Reference Numeral 12 indicates a signal line. Reference Numeral 13 shows a plate line, and Reference Numeral 101 designates a memory cell. Reference Numeral 102 shows a switching transistor of the memory cell, and Reference Numeral 104 indicates a ferroelectric capacitor. In the following, it is to be noted that elements corresponding or similar to those shown in the preceding drawings are given the same Reference Numerals, and explanation thereof will be omitted.

In addition, FIG. 6 shows a model of the hysteresis characteristics of the ferroelectric capacitor 104 shown in FIG. 5. Differently from the 2T/2C type memory cell, in the 1T/1C type memory cell, the two stable conditions "A" and "B" of the ferroelectric capacitor are considered to correspond the data "1" and "0", respectively.

Referring to FIG. 7, there is shown a partial circuit diagram of a memory cell array using the 1T/1C type memory cell. In this case, for example, when the memory cell 101A is selected, a signal voltage from the memory cell appears only on the data signal line 12A. Thus, when the 1T/1C type memory cell is used, it is necessary to generate a reference level used in the sense amplification, on a pairing data line /12A, by means of a special means. For this purpose, the circuit shown in FIG. 7 additionally includes reference level generating circuits 108A to 108D and control signal lines 17A and 17B for those circuits 108A to 108D. A specific method for generating the reference level, is disclosed for example in the above referred 1994 IEEE International Solid-State Circuits Conference (ISSCC), Feb. 18, 1994, Digest of Technical Papers, "Transaction of International Solid-State Circuits Conference (ISSCC)", pages 268–269. The key point of the reference level generation is to generate an intermediate voltage between the data signal line voltage when the signal corresponding to "1" is read out from the memory cell and the data signal line voltage when the signal corresponding to "0" is read out from the memory cell.

Referring to FIG. 8, there is illustrated a timing chart of an operation of the memory cell 101A in the circuit shown in FIG. 7. Furthermore, for reference, the polarized condition of each of the ferroelectric capacitor 104A at an end of each of periods (1) to (6) in FIG. 4 when the data "1" is read, is shown below the timing chart in FIG. 8.

In the case of reading the signal to the data signal line 12A, the reference level generating circuit 108B is controlled to generate the reference level on the pairing data signal line /12A, so that the reference level generated by the reference level generating circuit 108B is read out to the data signal line /12A. The other operation is the same as that of the 2T/2C type memory cell, and further explanation will be omitted for simplification of description.

Furthermore, 1988 IEEE International Solid-State Circuits Conference (ISSCC), Feb. 18, 1988, Digest of Technical Papers, pages 130–131, proposed an example of non-volatile memory in which a ferroelectric capacitor is combined with a flipflop of the type used in a static random access memory (SRAM) (This type memory will be called a "SRAM+ferroelectric memory cell" hereinafter).

Referring to FIG. 9, there is shown a circuit diagram of one memory cell of the "SRAM+ferroelectric memory cell" memory. In FIG. 9, Reference Numeral 18 designates a selection line for an SRAM part, and Reference Numerals 19 and /19 indicate a pair of complementary data signal lines for the SRAM part. Reference Numerals 20 and 21 show a flipflop power supply line. In addition, Reference Numeral 109 designates a flipflop, and Reference Numerals 110 and 111 indicate an N-channel MOS transistor constituting the flipflop. Reference Numerals 112 and 113 show a P-channel MOS transistor constituting the flipflop, and Numerals 114 and 115 show a memory cell selection transistor.

In the memory using this type of memory cell, after the memory is powered on, data is transferred from the ferroelectric capacitor to the flipflop, and when the memory is in a powered-on condition, the memory cell is used as the SRAM cell. Before the memory is powered off, data is transferred from the flipflop to the ferroelectric capacitor, so that after the memory is powered off, the data is held.

Here, causing various elements in FIG. 9 to correspond to various elements shown in FIGS. 1 and 5, the memory cell selection signal line and the data signal lines for the "SRAM+ferroelectric memory cell" memory are the lines 18 and 19 and /19, but the memory cell selection signal line and the data signal lines for the ferroelectric memory are the lines 11 and 12 and /12. In addition, the transfer gate for transferring the data from the ferroelectric capacitor to the data signal line is the transistors 102 and 103. As mentioned hereinbefore, in FIG. 9, elements corresponding or similar to those shown in FIGS. 1 and 5 are given the same Reference Numerals.

Referring to FIG. 10, there is shown a timing chart illustrating an operation of writing data to the ferroelectric capacitors 104 and 105 and an operation of reading data from the ferroelectric capacitors 104 and 105 to the flipflop 109. Correspondence between the polarized condition of the capacitors 104 and 105 and the data "1" and "0" is similar to the case shown in FIG. 2. Furthermore, for reference, the polarized condition of each of the ferroelectric capacitors 104 and 105 at an end of each of periods (1) to (10) in FIG. 10 in the case of writing and reading the data "1", is shown below the timing chart in FIG. 10.

In the case of writing the data from the flipflop 109 to the ferroelectric capacitors 104 and 105, the signal selection line 11 is brought to the high level during the period (1) in which the flipflop 109 holds the data (in the shown example, the data signal line 12 is at the high level and the data signal line /12 is at the low level). In the succeeding periods (2) and (3), the plate line 13 is brought from the low level to the high level, and then, from the high level to the low level. Thereafter, during the period (4), the flipflop power supply line 21 is brought to the low level, so as to power down the flipflop. Lastly, during the period (5), the selection signal line 11 is brought to the low level. Thus, in the capacitors 104 and 105, the polarized condition corresponding to the data stored in the flipflop 109 is set. Thereafter, even if the memory is powered off, the data is held.

In the case of reading data from the capacitors 104 and 105 to the flipflop 109, during the period (6), the selection signal line 11 is brought to the high level, and during the next period (7), the plate line 13 is driven from the low level to the high level, so that a voltage is applied between the opposing electrodes of the capacitors 104 and 105 so as to read an electric charge corresponding to the polarized condition, onto the data signal lines 12 and /12. Thereafter, during the period (8), the flipflop power supply line 21 is brought to the high level to activate the flipflop, so that the signal voltage read out during the period (7) is amplified. During the next period (9), the plate line 13 is returned to the low level, and then, during the period (10), the signal selection line 11 is returned to the low level, to terminate the data reading operation. Thereafter, the memory cell can be used as the conventional SRAM.

In FIG. 10, at the end of the period (1), the polarized condition of the capacitor 15 is indefinite, but at the end of the period (5), the polarized condition is definite. Therefore, it is no a problem that the polarized condition of the capacitor 15 is indefinite at the end of the period (1). In addition, at the end of the period (10), the voltage is applied to the opposing electrodes of the capacitor 104, and therefore, the polarized condition does not correspond to the voltage "0". However, this is not a problem, since the polarized condition is determined at a next time of writing the data.

In the shown example, it is possible to use a passive element such as a resistor in place of the P-channel transistors 112 and 113 of the flipflop 109 shown in FIG. 9.

The above mentioned example adopts a system of reading the data by driving all the plate lines 13 from the low level to the high level so as to apply both positive and negative voltages to the opposing electrodes of the ferroelectric capacitor. However, it is possible to read the data by setting an intermediate voltage on the plate lines so as to apply both positive and negative voltages to the opposing electrodes of the ferroelectric capacitor. Referring to FIG. 11, there is shown a partial circuit diagram of a memory cell array of a memory adopting such a data reading system. In FIG. 11, Reference Numerals 116A and 116B designate a data signal line precharge balance control circuit, and Reference Numeral 22 shows a data signal line balance control signal line. The other construction is the same as that shown in FIG. 7.

Referring to FIG. 12, there is shown a timing chart illustrating an operation of the memory shown in FIG. 11. Here, it is to be noted that the plate line 13 is fixed to an intermediate between the high level voltage and the low level voltage. Now, the reading and writing operations of the memory cell 101A will be described with reference to FIGS. 11 and 12. Furthermore, for reference, the polarized condition of each of the ferroelectric capacitor 104A at an end of each of periods (1) to (7) in FIG. 12 is shown below the timing chart in FIG. 12.

First, during the period (1), the data signal line precharge control signal 14 is brought to the low level, so as to cancel the precharging condition of the data signal line. Here, the precharge level of the data signal line is the ground level, similar to the above mentioned examples. During the next period (2), the selection signal line 11A is brought to the high level, so as to output the data from the memory cell 101A to the data signal line 12A. Here, a point different from the operation of FIG. 29 is that the plate line 13 is not driven. Since the precharge level of the data signal line is the ground level and the plate line is an intermediate voltage (called Vm), when the memory cell transistor 102A is rendered conductive during the period (2), a voltage of almost −Vm is applied between the opposing electrodes of the ferroelectric capacitors 104A, assuming that the direction from the plate line to the data signal line is a positive voltage. As a result, a signal voltage corresponding to the polarized condition of the ferroelectric capacitor 104A is read out to the data signal line 12A. At the same time, a reference level is applied to the pairing data signal line /12A from the circuit 108B. In the succeeding period (3), the sense amplifier control signal line 16 is activated to sense-amplify a voltage difference between the pair of data signal lines 12A and /12A.

Incidentally, in the case of writing the memory cell with data supplied from a device external to the memory, it is necessary to set a pair of voltages corresponding to a desired data to be written, onto the pair of data signal lines 12A and /12A during the period (4).

During the period (5), the sense amplifier control signal line 16 is brought to the low level so as to deactivate the sense amplifier. In addition, the data signal line balance control signal line 22 is brought to the high level, so as to bring the data signal line level to the intermediate voltage Vm which is the same as that of the plate line. With this arrangement, the polarization of the memory cell capacitor can be returned to the condition just before the data reading.

During the period (6), the selection signal line 11A is brought to the low level, so as to render the memory cell transistor non-conductive. Thereafter, during the period (7), the pair of data signal lines 12A and /12A are precharged to the ground level. Thus, one cycle of a memory cell access operation is completed.

The signal voltage read out from the ferroelectric capacitor depends upon the magnitude of the voltage applied between the opposing electrodes of the ferroelectric capacitor. Generally, the larger the voltage applied between the opposing electrodes of the ferroelectric capacitor is, the larger the obtained signal voltage becomes. In the operation of the above mentioned ferroelectric memory, the magnitude of the voltage applied between the opposing electrodes of the ferroelectric capacitor depends upon the voltage set on the plate line and the amplitude of the voltage of the data signal line. Accordingly, the set voltage of the plate line and the amplitude of the voltage of the data signal line may be set to any value if they makes it possible that the sense amplifier can properly sense-amplifies the signal voltage read out from the ferroelectric capacitor. For example, there is a method of making the set voltage of the plate line to one half of the power supply voltage and of making the amplitude of the voltage of the data signal line between the ground voltage and the power supply voltage. Here, the power supply voltage may be supplied from an external of the memory or may be a voltage generated by a voltage generating circuit provided internally in the memory.

In the examples as mentioned above, the precharge level of the data signal line is at the ground level. However, the precharge level of the data signal line is not limited to the ground level, and if the precharge level is different from the plate line setting voltage Vm, the precharge level may be any value if a not-zero voltage is applied between the opposing electrodes of the ferroelectric capacitor when the selection signal line 11A is brought to the high level.

Referring to FIG. 13, there is shown a specific circuit of the data signal line precharge balance control circuit 116A and 116B. Data signal line precharge transistors 117 and 118 are similar to those shown in FIGS. 3 and 7, and additionally, a data signal line balance transistor 119 is provided between the pair of data signal lines 12 and /12. In a condition that the data signal lines 12 and /12 are at the power supply voltage and the ground voltage, respectively, if the transistor 119 is turned on, since the data signal lines 12 and /12 have the same parasitic capacitance, the data signal lines 12 and /12 become a half of the power supply voltage. This circuit is effective when the set voltage of the plate line is similarly a half of the power supply voltage.

The example shown in FIG. 11 has been explained in the case of the 1T/1C type memory cell. However, the ferroelectric memory operating without dynamically driving the plate line is not limited by the type of the memory cell. The 2C/2T type and the "SRAM+ferroelectric memory cell" type as mentioned above can similarly operate.

However, the above mentioned conventional ferroelectric memory has such a problem that when data is read out from the memory cell, a sufficient voltage is not applied between the opposing electrodes of the ferroelectric capacitor because of the following reasons:

In the ferroelectric memory operating while dynamically driving the plate line as the examples explained with reference to FIGS. 4, 8 and 10 (called a "plate drive type" hereinafter), when the data is read out from the memory cell, the bit line becomes floating. Therefore, when the plate line is driven from the low level to the high level, the voltage of the data signal line varies by action of a coupling through the ferroelectric capacitor of the memory cell. As a result, a voltage not smaller than a coercive voltage Vc converted by multiplying a coercive electric field Ec by a film thickness of the ferroelectric material, is not often applied between the opposing electrodes of the ferroelectric capacitor. Accordingly, the polarization inversion of the ferroelectric material does not occur.

This will be explained in detail with reference to FIG. 14, which illustrates the circuit of the 1T/1C type ferroelectric memory cell. In FIG. 14, a parasitic capacitance of the data line is represented by CD, and the capacitance of the normal dielectric component of the ferroelectric capacitor is represented by CS.

Now, assume that in a condition that the memory cell switching transistor 102 is non-conductive, namely, the memory cell 101 is in a non-selected condition, a voltage VBOOT for turning on the transistor 102 is applied to the selection signal line 11. In addition, the plate line 13 is driven from an initial condition voltage VPL0 to a final condition voltage VPL. Furthermore, it is assumed that an initial voltage and a final voltage of the data signal line 12 are VDL0 and VDL, respectively. Additionally, an initial voltage of a node 23 interconnecting the transistor 102 and the ferroelectric capacitor 104 is VS0 and a final voltage of the node 23 becomes VDL since the transistor 102 is turned on.

Under the above mentioned condition,

All electric charge Qi of the system shown in FIG. 14 in an initial condition, is expressed as follows:

$$Qi=CS\times(VS0-VPL0)+CD\times VDL0 \qquad (1)$$

All electric charge Qf of the system shown in FIG. 14 in a final condition, is expressed as follows:

$$Qf=CS\times(VDL-VPL)+CD\times VDL \qquad (2)$$

Since Qi must be equal to Qf, an absolute value |VPL−VDL| of the voltage applied between the opposing electrodes of the ferroelectric capacitor is expressed as follows:

$$|VPL-VDL|=\left|\frac{CS\times(VPL0-VS0)+CD\times(VPL-VDL0)}{CD+CS}\right| \qquad (3)$$

On the other hand, since |VPL−VDL| must be not smaller than the coercive voltage Vc of the ferroelectric capacitor, the following relation can be expressed:

$$|VPL-VDL|\geq Vc. \qquad (4)$$

Here, assuming that the precharge voltage of the data signal line is the ground voltage (namely, VDL0=0) and both of the VS0 and VPL0 are the ground level, the equation (4) can be expressed as follows:

$$\left|\frac{CD\times VPL}{CD+CS}\right|\geq Vc \qquad (5)$$

Here, assume that Vc=1.5 V and VPL=3.3 V, the equation (5) can be expressed as follows:

$$CD\geq 0.833\ldots\times CS \qquad (6)$$

This equation (6) indicates that since the parasitic capacitance CD of the data signal line has a lower limit, unless the parasitic capacitance is not smaller than the lower limit, a voltage not smaller than Vc is not applied between the opposing electrodes of the ferroelectric capacitor. Thus, since the voltage of the data signal line is caused to vary by action of the coupling through the ferroelectric capacitor by dynamically driving the plate line, it is generally said that unless the condition by defined by the equations (3) and (4) is fulfilled, a sufficient read-out voltage cannot be obtained from the memory cell.

On the other hand, in the ferroelectric memory operating without dynamically driving the plate line, as the examples explained with reference to FIG. 12 (called a "plate non-drive type" hereinafter), a problem similar to that of the plate non-drive type occurs even if the mechanism of generation of the problem is different from that in the plate non-drive type.

In the plate non-drive type of ferroelectric memory, when the memory cell is not accessed, it is necessary to maintain the voltage applied between the opposing electrodes of the ferroelectric capacitor at zero, in order to prevent break of the stored data. In other words, if the plate line is set to the intermediate voltage, a node of one opposing electrode of the ferroelectric capacitor, namely, a node 23 interconnecting the memory cell switching transistor 102 and the ferroelectric capacitor similarly becomes the intermediate voltage. In this condition, if the selection signal line is brought to the high level in order to read out data from the memory cell, first, the electric charge stored in the node 23 interconnecting the memory cell switching transistor 102 and the ferroelectric capacitor similarly becomes the intermediate voltage, is outputted to the data signal line, so that the voltage level of the data signal line changes from the precharge level. As a result, the voltage not smaller than the coercive voltage Vc is no longer applied between the opposing electrodes of the ferroelectric capacitor, so that the polarization inversion of the ferroelectric material no longer occurs.

This will be explained in detail with reference to FIG. 15, which is similar to FIG. 14, except that the voltage of the plate line 13 is fixed to a constant value VPLC.

Now, consider that an initial condition that the memory cell switching transistor 102 is non-conductive, namely, the memory cell 101 is in a non-selected condition, is changed to a final condition after a voltage VBOOT is applied to the selection signal line 11 so as to turn on the transistor 102.

Excepting that the voltage of the plate line 13 is VPLC, the same condition as that explained with reference to FIG. 14 is applied.

All electric charge Qi of the system shown in FIG. 15 in an initial condition, is expressed as follows:

$$Qi = CS \times (VS0 - VPLC) + CD \times VDL0 \tag{7}$$

All electric charge Qf of the system shown in FIG. 15 in a final condition, is expressed as follows:

$$Qf = CS \times (VDL - VPLC) + CD \times VDL \tag{8}$$

Since Qi must be equal to Qf, an absolute value |VPL−VDL| of the voltage applied between the opposing electrodes of the ferroelectric capacitor in the final condition is expressed as follows:

$$|VPLC - VDL| = \left| \frac{CS \times (VPLC - VS0) + CD \times (VPLC - VDL0)}{CD + CS} \right| \tag{9}$$

On the other hand, since |VPL−VDL| must be not smaller than the coercive voltage Vc of the ferroelectric capacitor, similarly to the plate drive type, the following relation can be expressed:

$$|VPLC - VDL| \geq Vc. \tag{10}$$

Here, assuming that the precharge voltage of the data signal line is the ground voltage (namely, VDL0=0) and both of the VS0 and VPLC are one half of the power supply voltage Vcc, the equation (10) can be expressed as follows:

$$\frac{1}{2} \times \left| \frac{CD + Vcc}{CD + CS} \right| \geq Vc \tag{11}$$

Here, assume that Vc=1.5 V and VPL=3.3 V, the equation (5) can be expressed as follows:

$$CD \geq 10 \times CS \tag{12}$$

Similarly to the equation (6), this equation (12) indicates that since the parasitic capacitance CD of the data signal line has a lower limit. Also in the plate non-drive type ferroelectric memory, it is generally said that unless the condition by defined by the equations (9) and (10) is fulfilled, a sufficient read-out voltage cannot be obtained from the memory cell.

The above mentioned discussion is directed to the lower limit of the parasitic capacitance CD of the data signal line. However, in the reading method in which the signal charge read out from the memory cell is outputted onto the data signal line as the signal voltage, if the 1T/1C type memory cell is used, the signal voltage VSIG is expressed as follows by using the electric charges Q0 and Q1 shown in FIG. 6 and a remnant polarization electric charge Qr:

$$VSIG = \frac{1}{2} \times \left| \frac{Q1 - Q0}{CD + CS} \right| = \frac{Qr}{CD + CS} \tag{13}$$

In the above equation, the factor (½) means that the reference level is determined to be a just intermediate level between the voltage of the data signal line when the data "0" is read out and the voltage of the data signal line when the data "1" is read out. If the reference level generated by the reference level generating circuit is shifted from the just intermediate level, the factor in question no longer is ½, but a value larger than 0 (zero) but smaller than 1.

Furthermore, the signal voltage VSIG must exceed the minimum voltage value VSE which can be normally amplified by the sense amplifier. Namely, $$VSIG \geq VSE \tag{14}$$

Namely, the equations (13) and (14) means that if the parasitic capacitance CD exceeds a certain value, the signal voltage VSIG becomes too small and therefore smaller than the minimum voltage value VSE which can be normally amplified by the sense amplifier. In other words, the memory cannot operate. Therefore, the parasitic capacitance CD has an upper limit.

Totally considering the above mentioned matters, the ferroelectric memory generally has a relation between the parasitic capacitance CD and the normal dielectric capacitance CS as shown in FIG. 16. In FIG. 16, the one-dot chain line indicates the lower limit of the parasitic capacitance CD in the plate drive type ferroelectric memory, and the dotted line indicates the lower limit of the parasitic capacitance CD in the plate non-drive type ferroelectric memory. The solid line indicates the upper limit of the parasitic capacitance CD required for obtaining from the memory cell the read-out signal voltage which can be normally data-amplified by the sense amplifier. The hatched region indicates an operation range in which the plate drive type and the plate non-drive type can operate.

In summary, the conventional ferroelectric memories have a problem in which when the data is read out from the memory cell, the voltage of the data signal line varies, although the mechanism of the voltage variation is different from one operation system to another, and in some condition, the coercive voltage Vc required to invert the polarization is not applied between the opposing electrodes of the ferroelectric capacitor, with the result that a normal data reading cannot be performed.

SUMMARY OF THE INVENTION

Accordingly, it is an object of the present invention to provide a ferroelectric memory and a method for controlling an operation thereof, which has overcome the above mentioned defect of the conventional ones.

Another object of the present invention is to provide a ferroelectric memory and a method for controlling an operation thereof, capable of perform a stable operation, by obtaining a sufficient read-out signal voltage.

The above and other objects of the present invention are achieved in accordance with the present invention by a ferroelectric memory comprising, a plurality of pairs of data signal lines for outputting and receiving data, a plurality of selection signal lines selected in accordance with an address signal, and a plurality of unitary memory cell arrays each arranged along a corresponding one pair of data signal lines of the plurality of pairs of data signal lines, each of the unitary memory cell arrays including:

a plurality of memory cells each including a ferroelectric capacitor having a capacitor dielectric composed of a ferroelectric material and sandwiched between a pair of opposing electrodes, a switching means connected to the ferroelectric capacitor and one of the corresponding pair of data signal lines, and controlled by a corresponding one of the selection signal lines, so that different polarized conditions of the ferroelectric capacitor correspond to different conditions of stored data, respectively, and when a first voltage, which is not zero, is applied between the opposing electrodes of the ferroelectric capacitor, since a current flowing between the ferroelectric capacitor and the corresponding data signal line is different dependently upon the polarized condition of the ferroelectric capacitor, the current is detected or a voltage appearing on the corresponding pair of data signal lines due to the current is detected for the purpose of reading out the stored data;

a means connected to the corresponding one pair of data signal lines, for detecting a current or voltage difference appearing between the corresponding pair of data signal lines; and a means connected to at least one of the corresponding pair of data signal lines, for absorbing, when data is read out from a memory cell by setting the selection signal line to a sufficient voltage for putting the memory cell in a selected condition, electric charges flowing into the at least one of the corresponding pair of data signal lines, because of factor other than the current caused due to the polarization of the ferroelectric capacitor, whereby a voltage not smaller than the coercive voltage of the ferroelectric capacitor can be applied between the opposing electrodes of the ferroelectric capacitor.

According to another aspect of the present invention, there is provided a method for controlling an operation of the above mentioned ferroelectric memory, the method performing the reading of data from the memory cell to be read out, by setting the corresponding data signal line connected to the memory cell to be read out, to a second voltage, by setting a plate line connected to the memory cell to be read out, to a third voltage which is different from the second voltage and also different from a voltage before the data reading operation, by setting the selection signal line connected to the memory cell to be read out, to a voltage for selecting the memory cell to be read out, so that a voltage difference is caused to occur between the opposing electrodes of the ferroelectric capacitor, whereby a signal corresponding to the data stored in the memory cell to be read out is outputted to the corresponding data signal line.

According to still another aspect of the present invention, there is provided a method for controlling an operation of the above mentioned ferroelectric memory, the method performing the reading of data from the memory cell to be read out, by setting the corresponding data signal line connected to the memory cell to be read out, to a second voltage, by setting a plate line connected to the memory cell to be read out, to a third voltage which is a fixed voltage different from the second voltage, by setting the selection signal line connected to the memory cell to be read out, to a fourth voltage for selecting the memory cell to be read out, so that a voltage difference is caused to occur between the opposing electrodes of the ferroelectric capacitor, whereby a signal corresponding to the data stored in the memory cell to be read out is outputted to the corresponding data signal line.

With the above mentioned arrangement, the means for suppressing the voltage variation on the data signal line when the data is read out from the memory cell is provided to ensure that a voltage not smaller than the coercive voltage is surely applied between the opposing electrodes of the ferroelectric capacitor. Thus, the ferroelectric memory can be stably operated.

The above and other objects, features and advantages of the present invention will be apparent from the following description of preferred embodiments of the invention with reference to the accompanying drawings.

DESCRIPTION OF THE PREFERRED EMBODIMENTS

Figure 11:
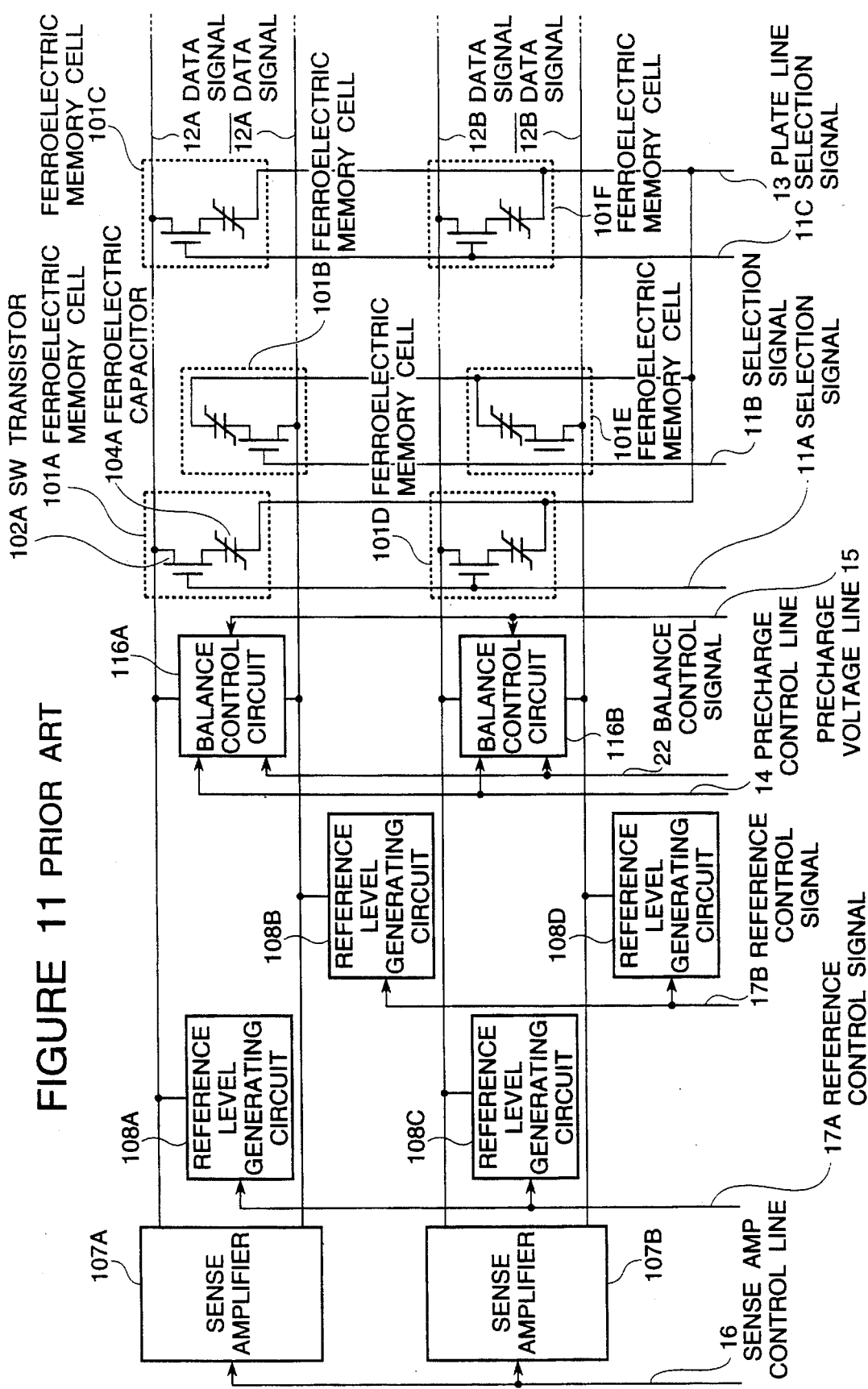
FIG. 11 is a partial circuit of a memory cell array in the plate non-drive type ferroelectric memory.
Figure 17:
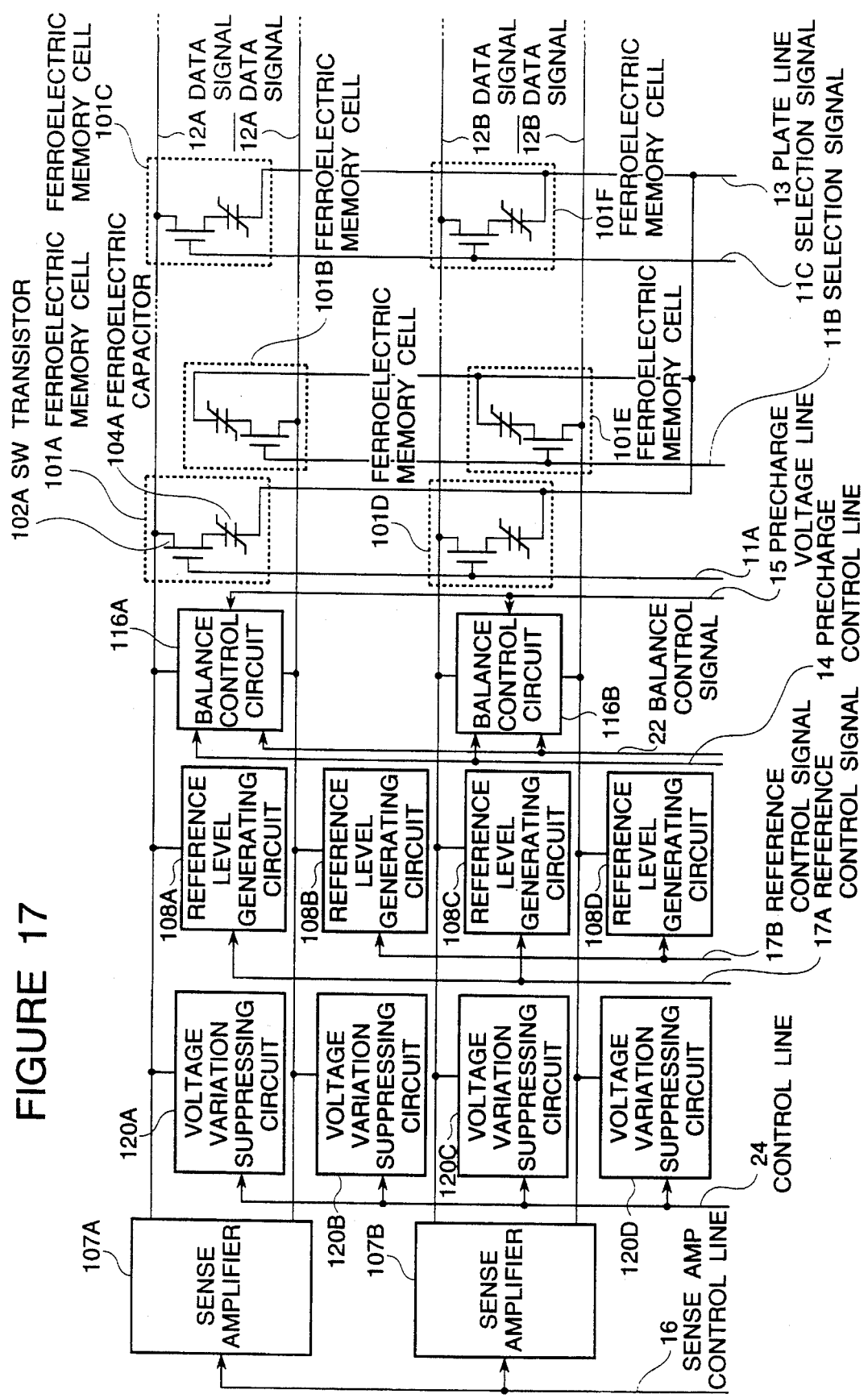
FIG. 17 is a circuit diagram of a first embodiment of the ferroelectric memory in accordance with the present invention, provided with means for suppressing the voltage variation on the data signal line.

Referring to FIG. 17, there is shown a circuit diagram of a first embodiment of the ferroelectric memory in accordance with the present invention, in which a voltage variation suppressing circuits 120A to 120B controlled by a data signal line voltage variation suppressing circuit control signal line 24 are connected to the data signal lines 12A, /12A, 12B and /12B, respectively in the ferroelectric memory as shown in FIG. 11. These voltage variation suppressing circuits 120A to 120B are configured to suppress the voltage variation on the data signal lines 12A, /12A, 12B and /12B, and therefore, constitute a means for absorbing noise electric charges other than electric charges generated by the polarization inversion of the ferroelectric material and outputted from the memory cell.

Figure 1:
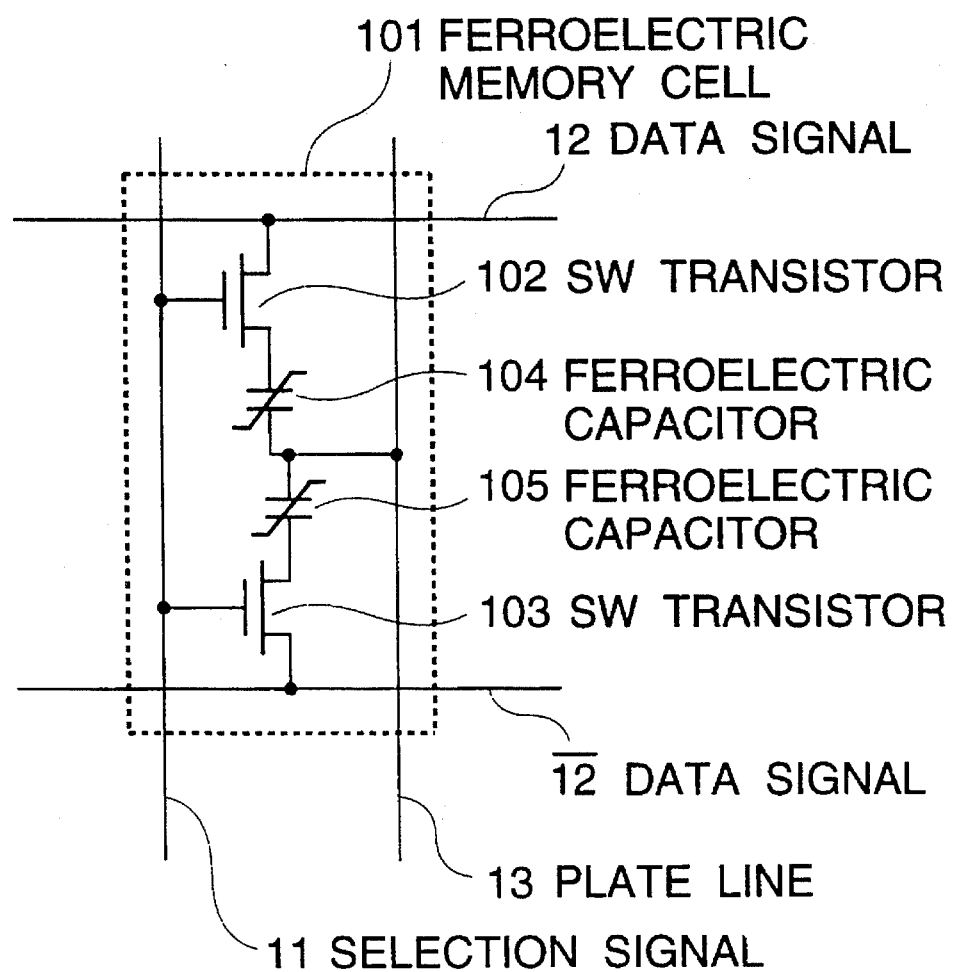
FIG. 1 a circuit diagram of the conventional ferroelectric memory cell constituted of two transistors and two ferroelectric capacitors.
Figure 2:
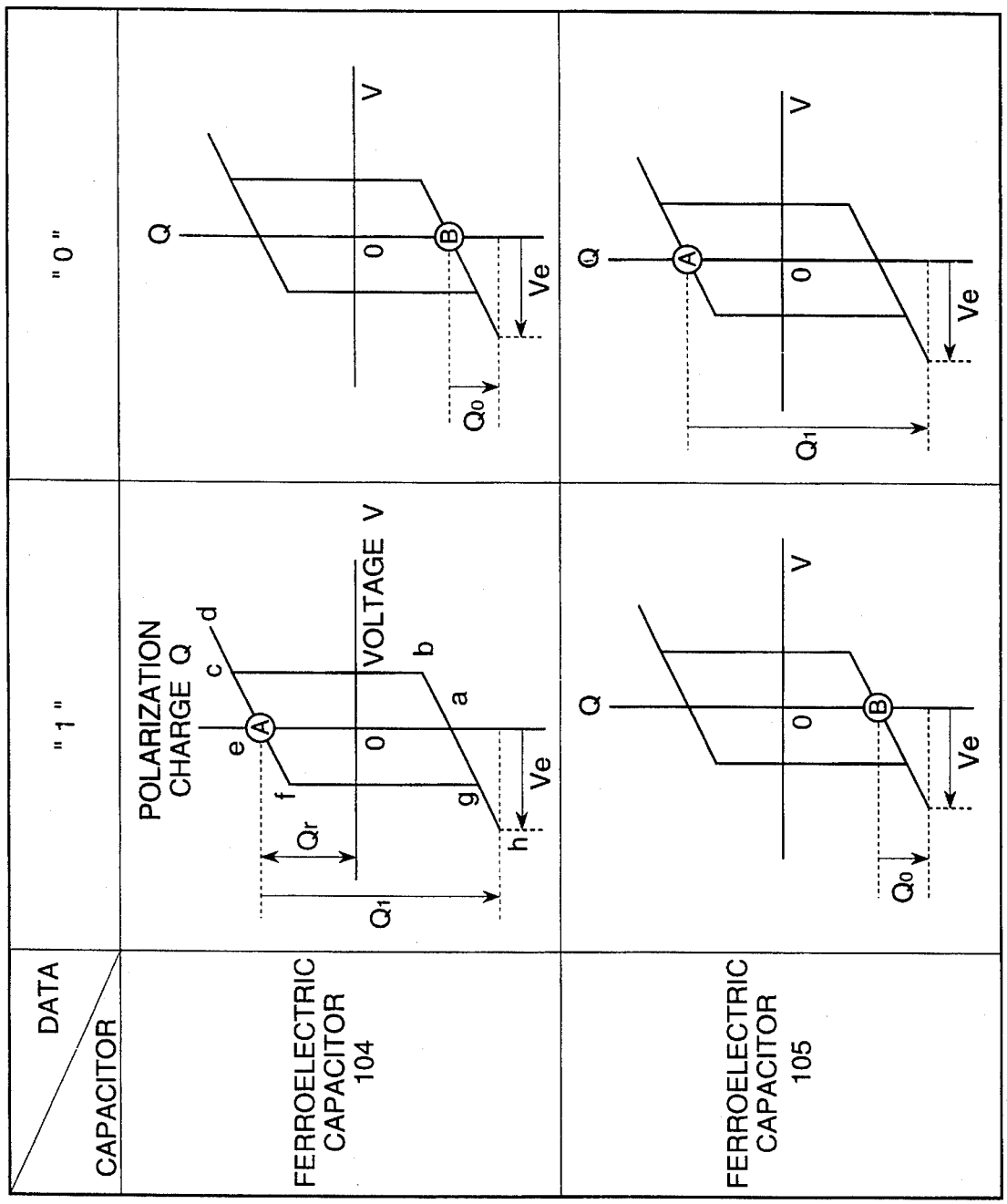
FIG. 2 illustrates a relation between the relation between the spontaneous polarization electric charge and the voltage between opposing electrodes of the ferroelectric capacitor, in the ferroelectric memory cell of the type shown in FIG. 1.
Figure 3:
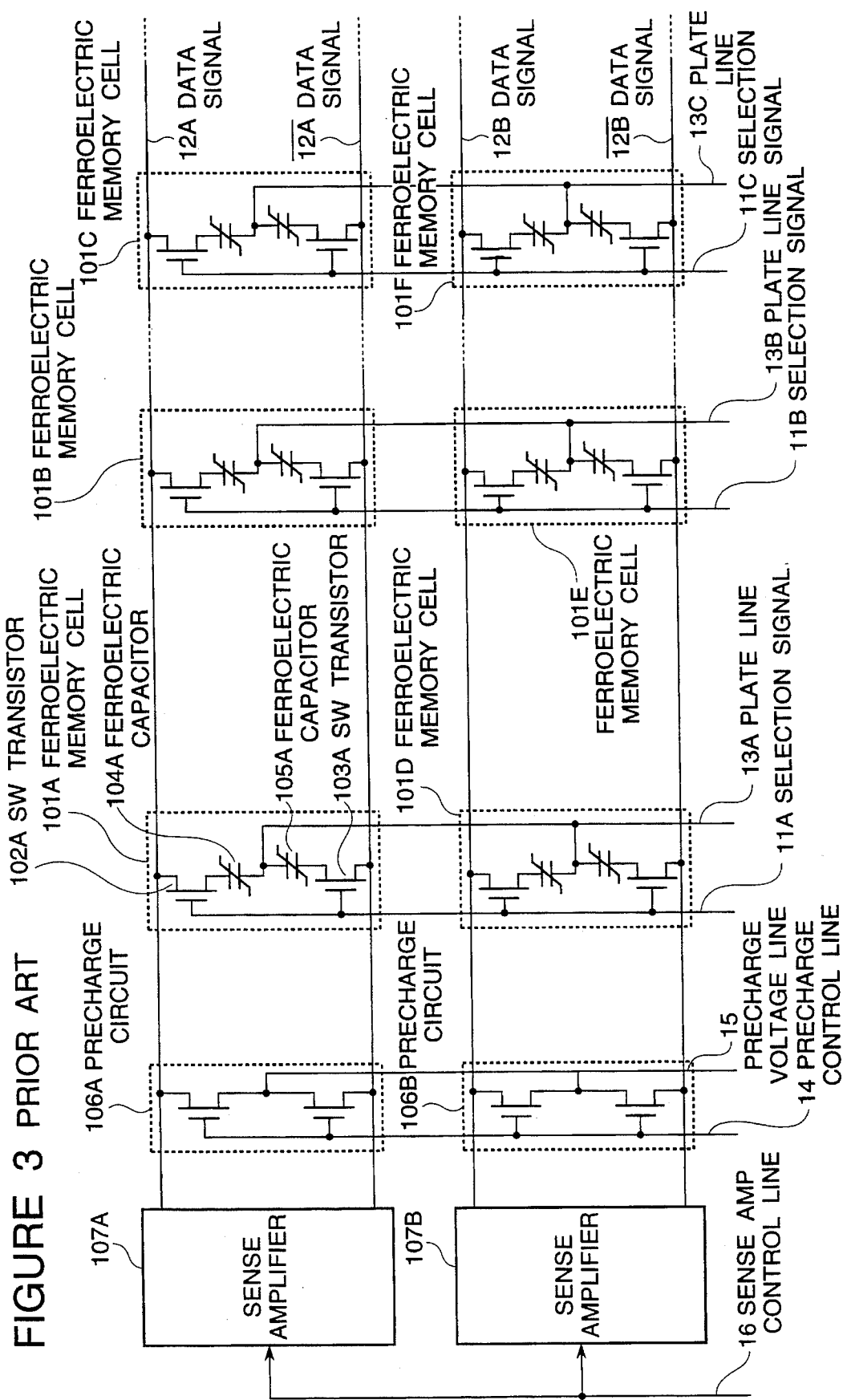
FIG. 3 is a partial circuit of a memory cell array in the ferroelectric memory using the memory cell of the type shown in FIG. 1.
Figure 4:
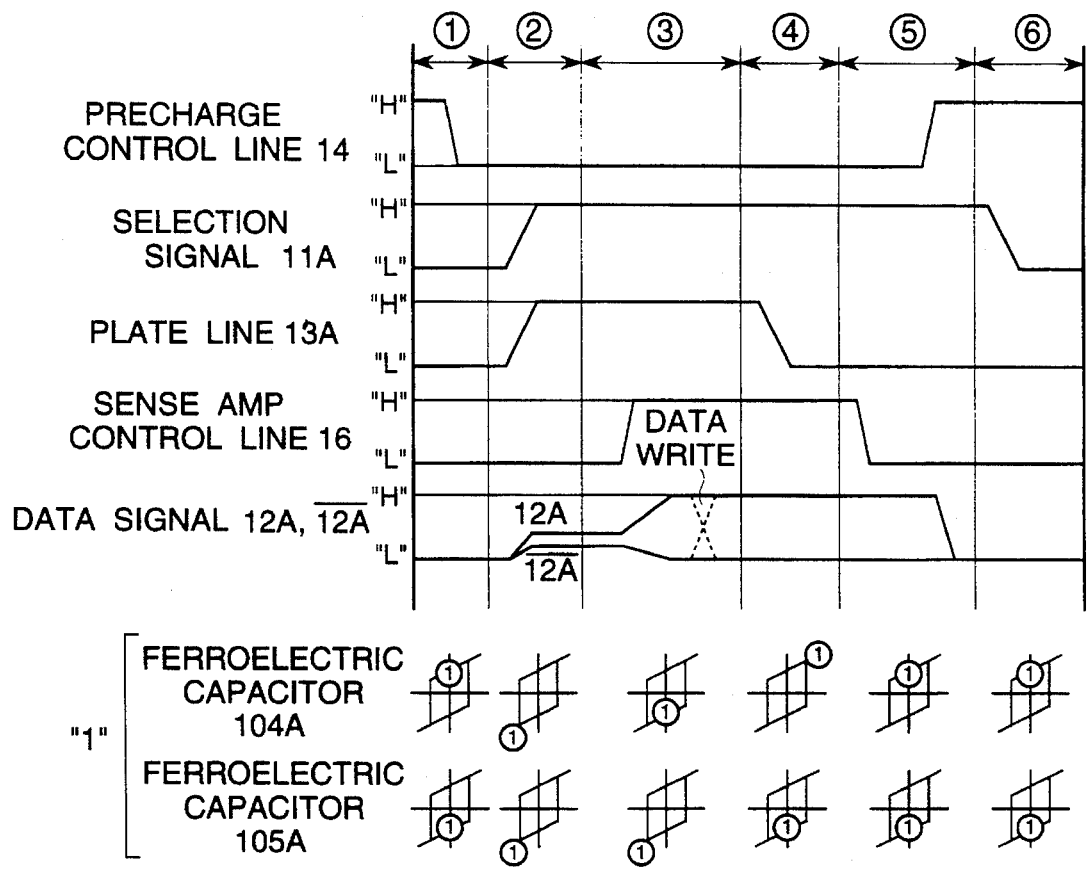
FIG. 4 is a timing chart illustrating an operation of the memory cell shown in FIG. 3.
Figure 5:
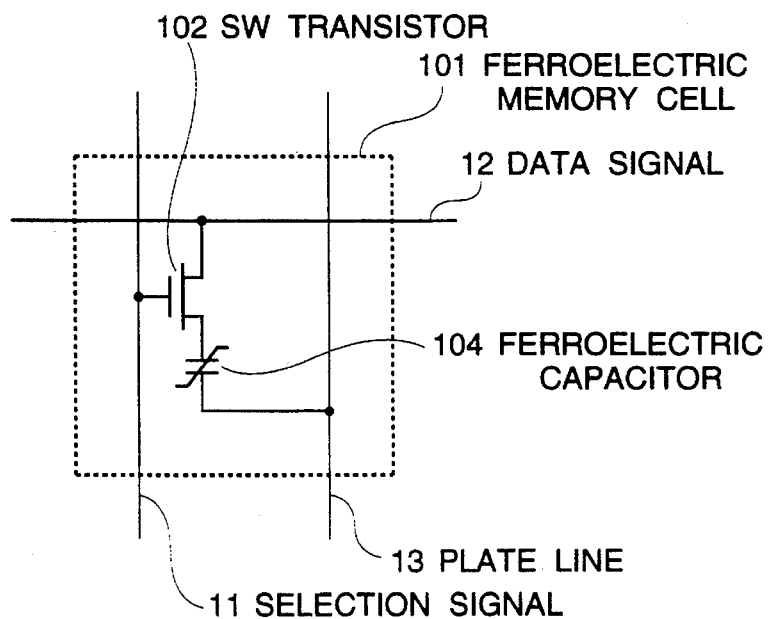
FIG. 5 a circuit diagram of the conventional ferroelectric memory cell constituted of one transistor and one ferroelectric capacitor.
Figure 6:
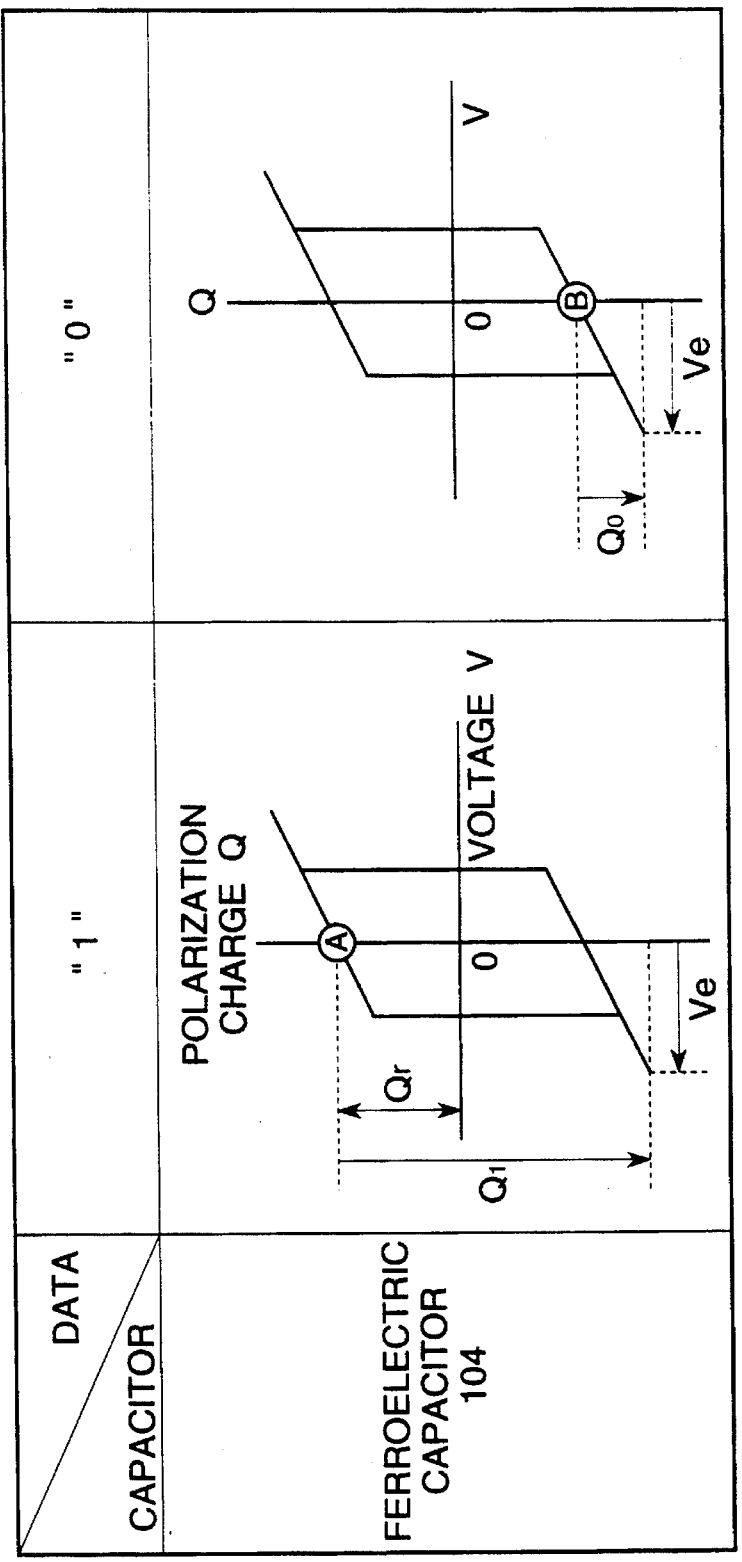
FIG. 6 illustrates a relation between the relation between the spontaneous polarization electric charge and the voltage between opposing electrodes of the ferroelectric capacitor, in the ferroelectric memory cell of the type shown in FIG. 5.
Figure 7:
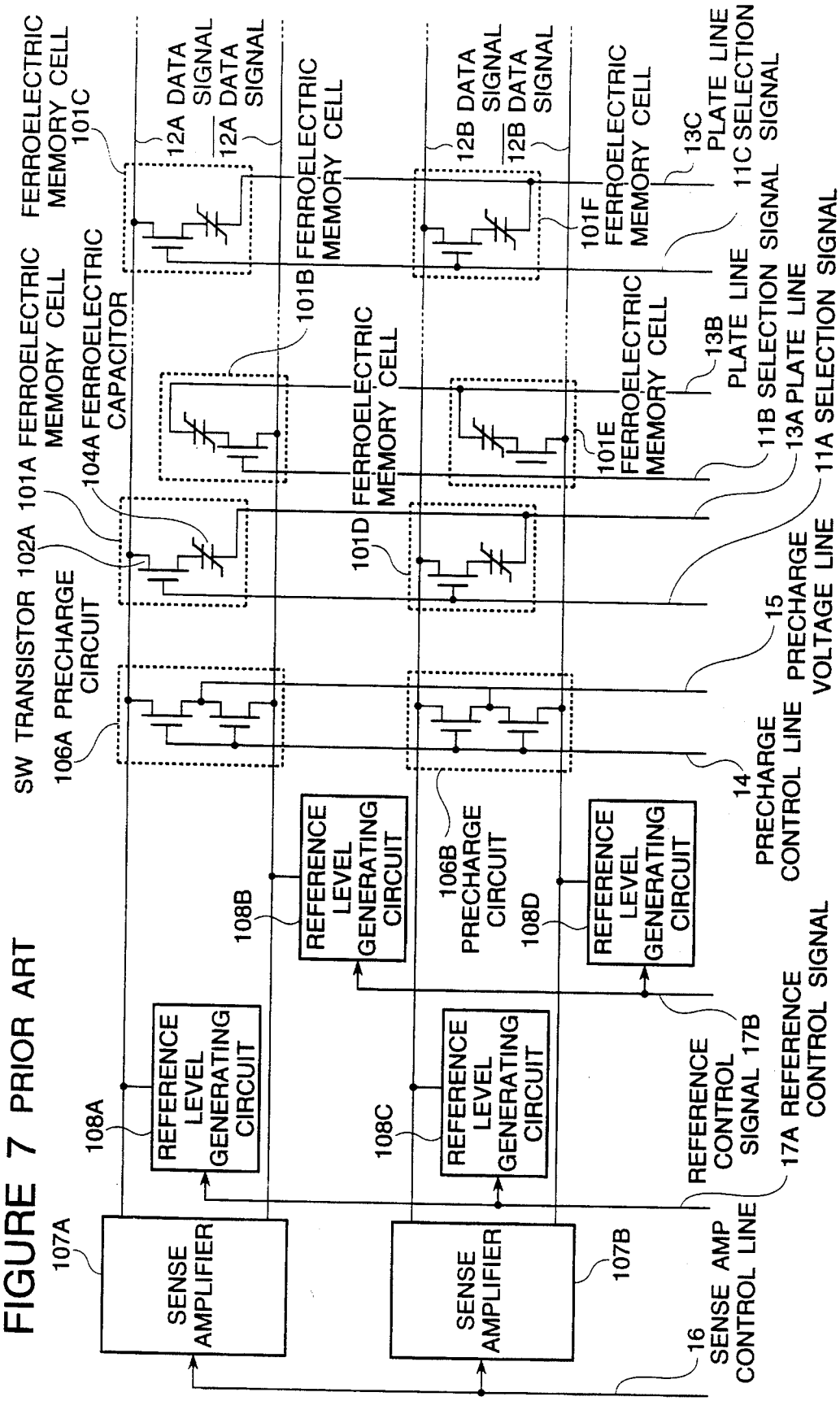
FIG. 7 is a partial circuit of a memory cell array in the ferroelectric memory using the memory cell of the type shown in FIG. 5.
Figure 8:
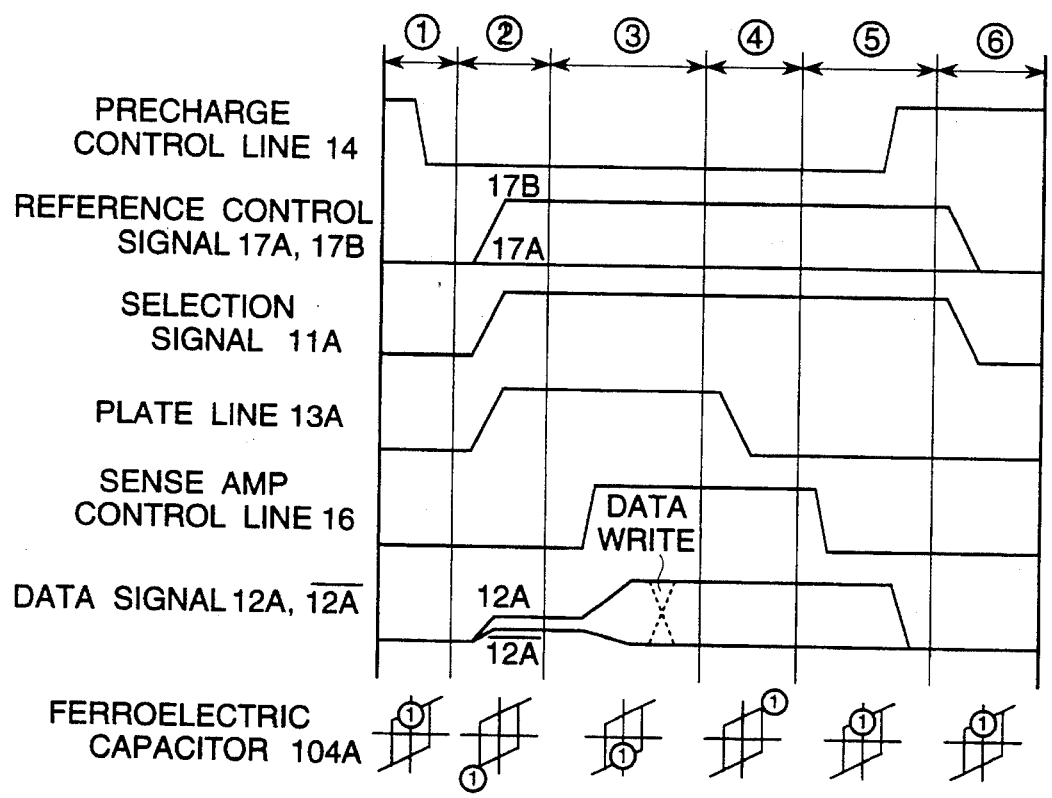
FIG. 8 is a timing chart illustrating an operation of the memory cell shown in FIG. 7.
Figure 18:
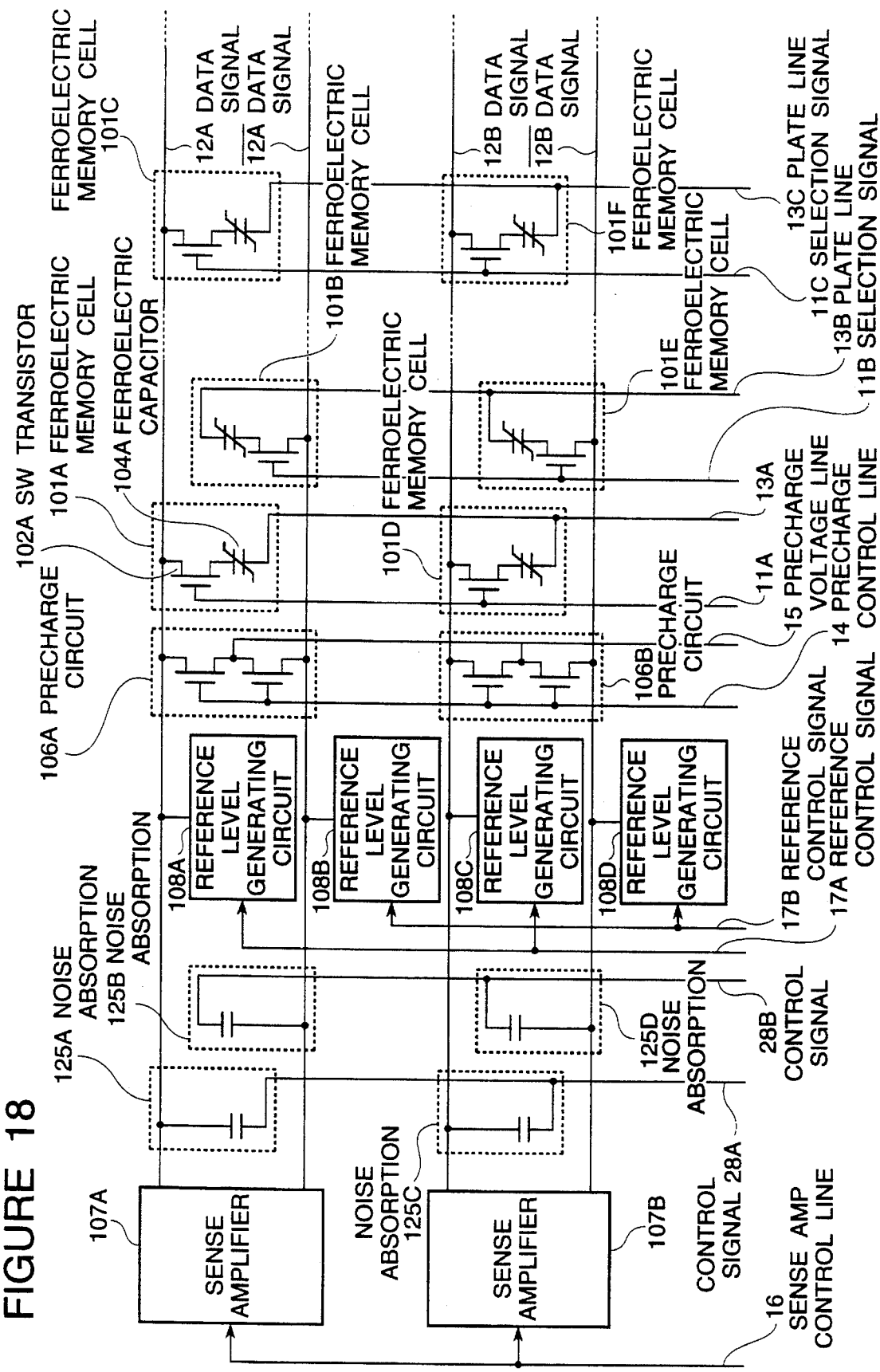
FIG. 18 is a circuit diagram of a second embodiment of the ferroelectric memory in accordance with the present invention, provided with a coupling capacitor connected to the data signal line.
Figure 19:
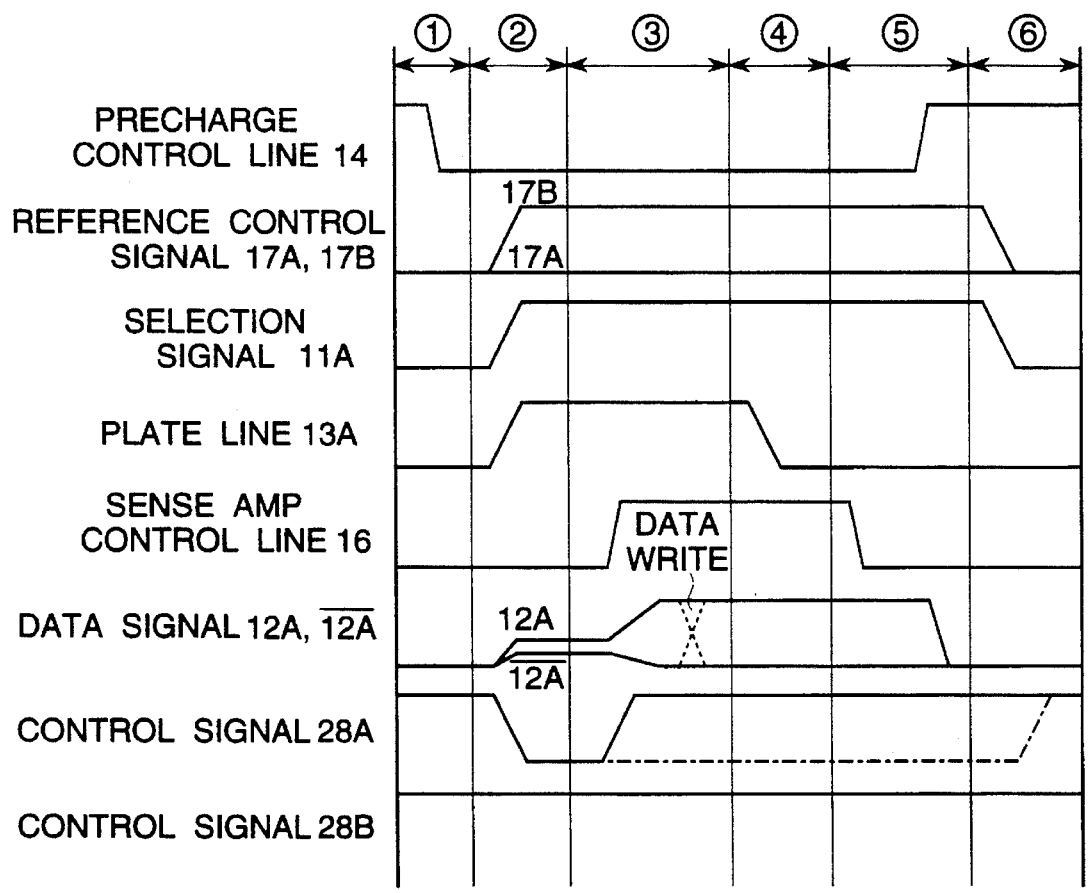
FIG. 19 is a timing chart illustrating an operation of the ferroelectric memory shown in FIG. 18.

Referring to FIG. 18, there is shown a second embodiment, in which, to the data signal lines 12A, /12A, 12B and /12B of the plate drive type ferroelectric memory shown in FIGS. 7 and 8, there are respectively connected, noise absorbing means 125A to 125D, which is specifically composed of a capacitor having one end connected to a corresponding one of the data signal lines 12A, /12A, 12B and /12B and the other end connected to a corresponding one of data signal line voltage variation suppressing circuit control signal lines 28A and 28B. FIG. 19 illustrates a timing chart of the operation of the memory shown in FIG. 18.

The control signal lines 28A and 28B are maintained at the high level in a standby condition, and brought to the low level before or at the same time as the selection signal lines 11A and 13A are brought to the high level, so that the capacitor is reverse-coupled against noises outputted from the memory cell, thereby absorbing the noises. The electric charge amount of noise absorbed can be modified by adjusting the size of the capacitor and the voltage level of the high level and the low level of the control signal lines 28A and 28B. Accordingly, these parameters can be set to a suitable value in view of the magnitude of the noise outputted from the memory cell.

The rising timing of the control signal line 28A may be at any time from the sense amplifier activation (as indicated by the solid line) until the end of the reading cycle (as indicated by the one-dot chain line). In this embodiment, the operation when the memory cell 101A is selected, is shown. But, when the memory cell 101B or 101E is selected, the operation of the control signal lines 28A and 28B become reverse. In this embodiment, the ferroelectric capacitor can be used as the above mentioned capacitor of the noise absorbing circuit 125A to 125D, and a plurality of capacitors can be used.

Figure 12:
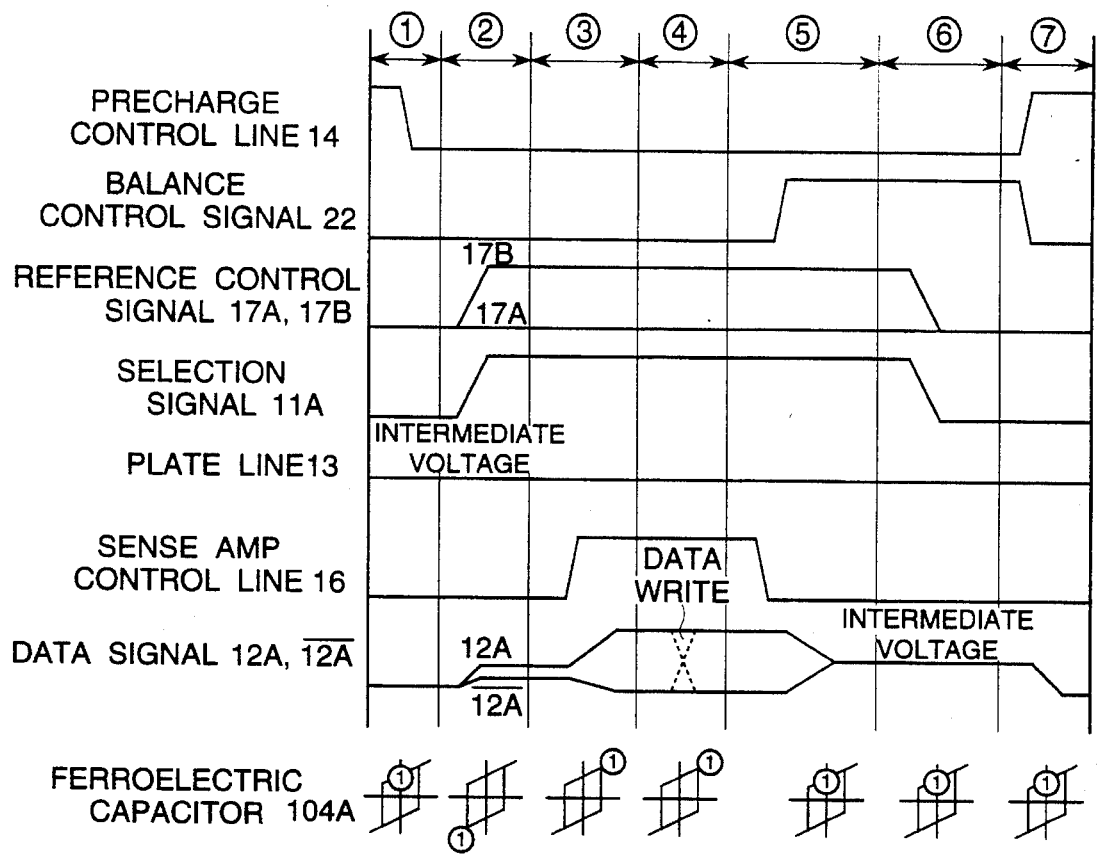
FIG. 12 is a timing chart illustrating an operation of the memory cell shown in FIG. 11.
Figure 13:
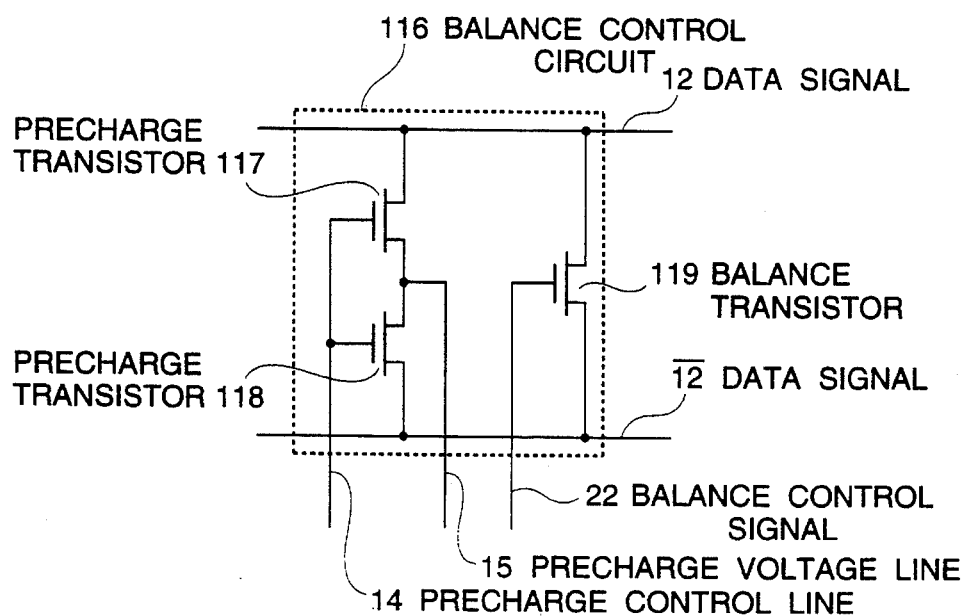
FIG. 13 is a circuit diagram of a specific circuit of the data signal line precharge balance control circuit.
Figure 14:
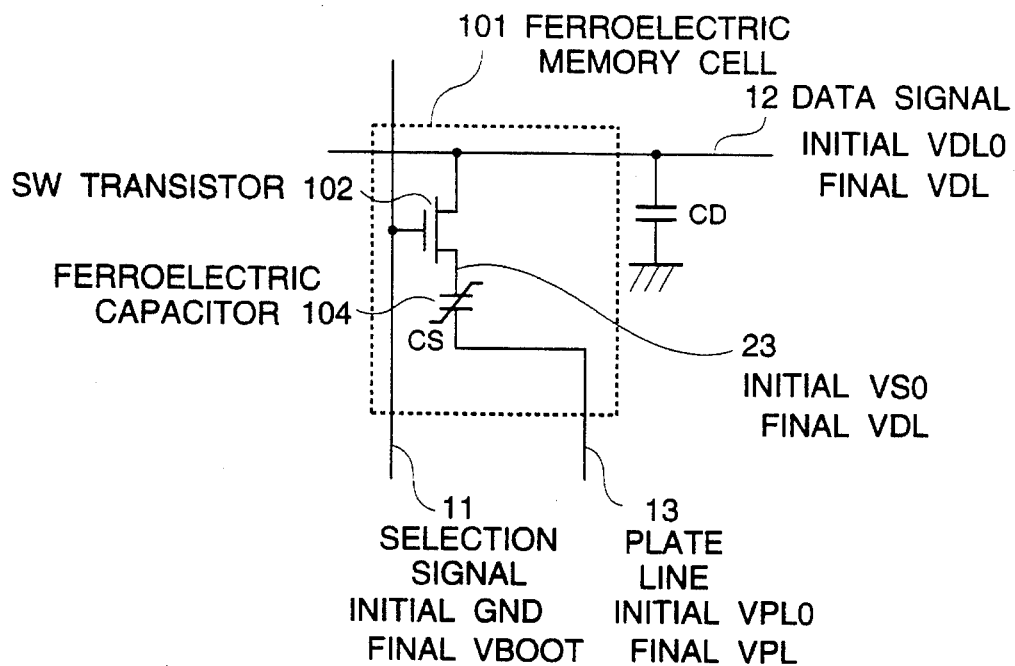
FIG. 14 is a circuit diagram for illustrating the voltage variation of the data signal line when the data is read out from the memory cell in the plate drive type ferroelectric memory.
Figure 15:
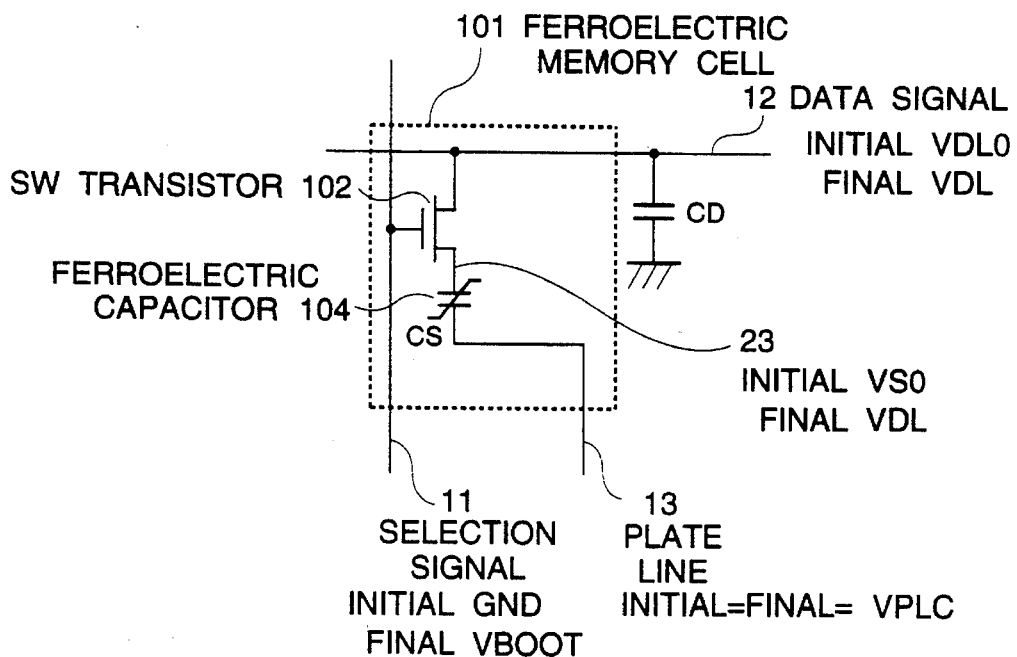
FIG. 15 is a circuit diagram for illustrating the voltage variation of the data signal line when the data is read out from the memory cell in the plate non-drive type ferroelectric memory.
Figure 16:
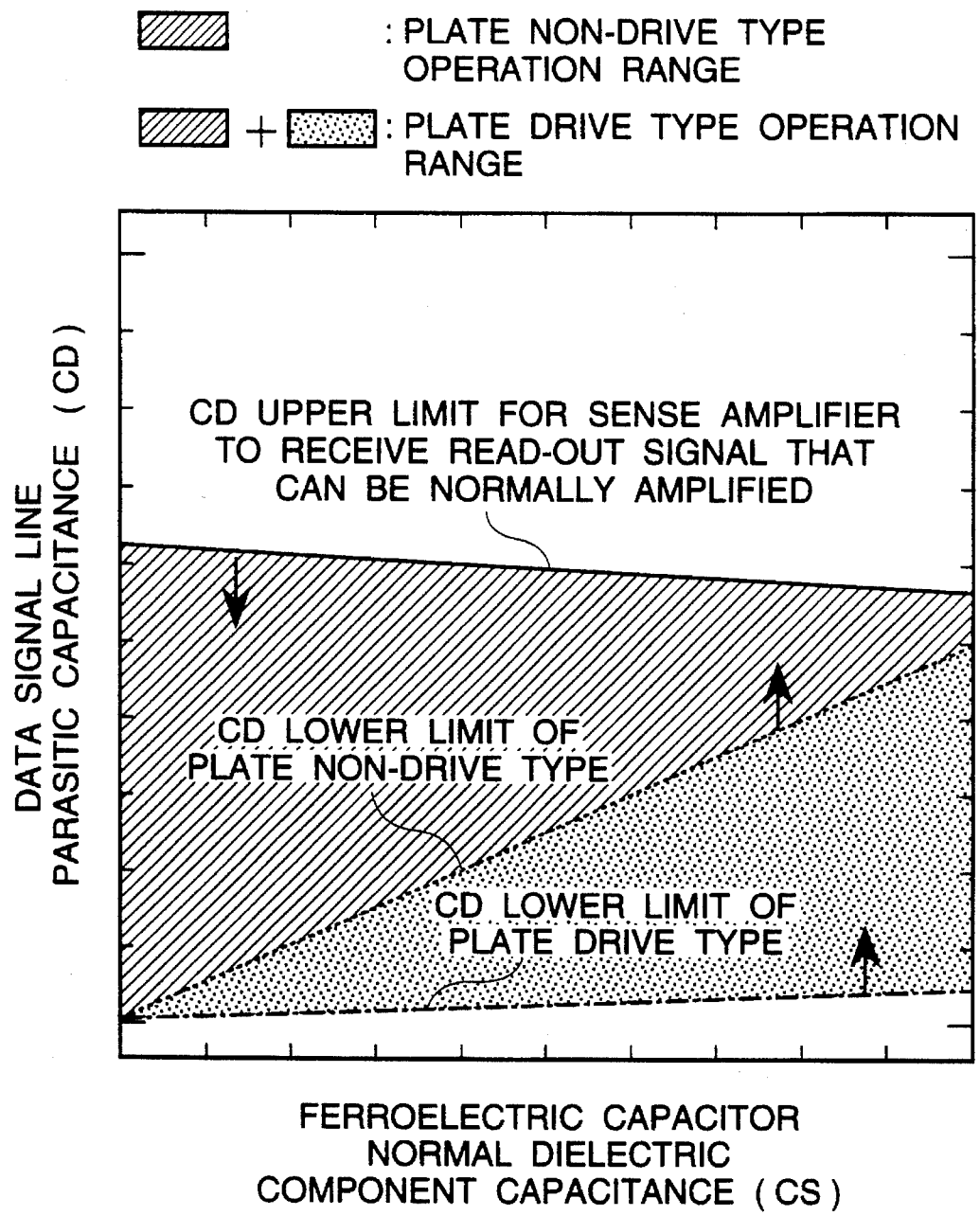
FIG. 16 illustrates a relation between the data signal line parasitic capacitance and the normal dielectric capacitance of the ferroelectric capacitor, and an operation range of the ferroelectric memory.
Figure 20:
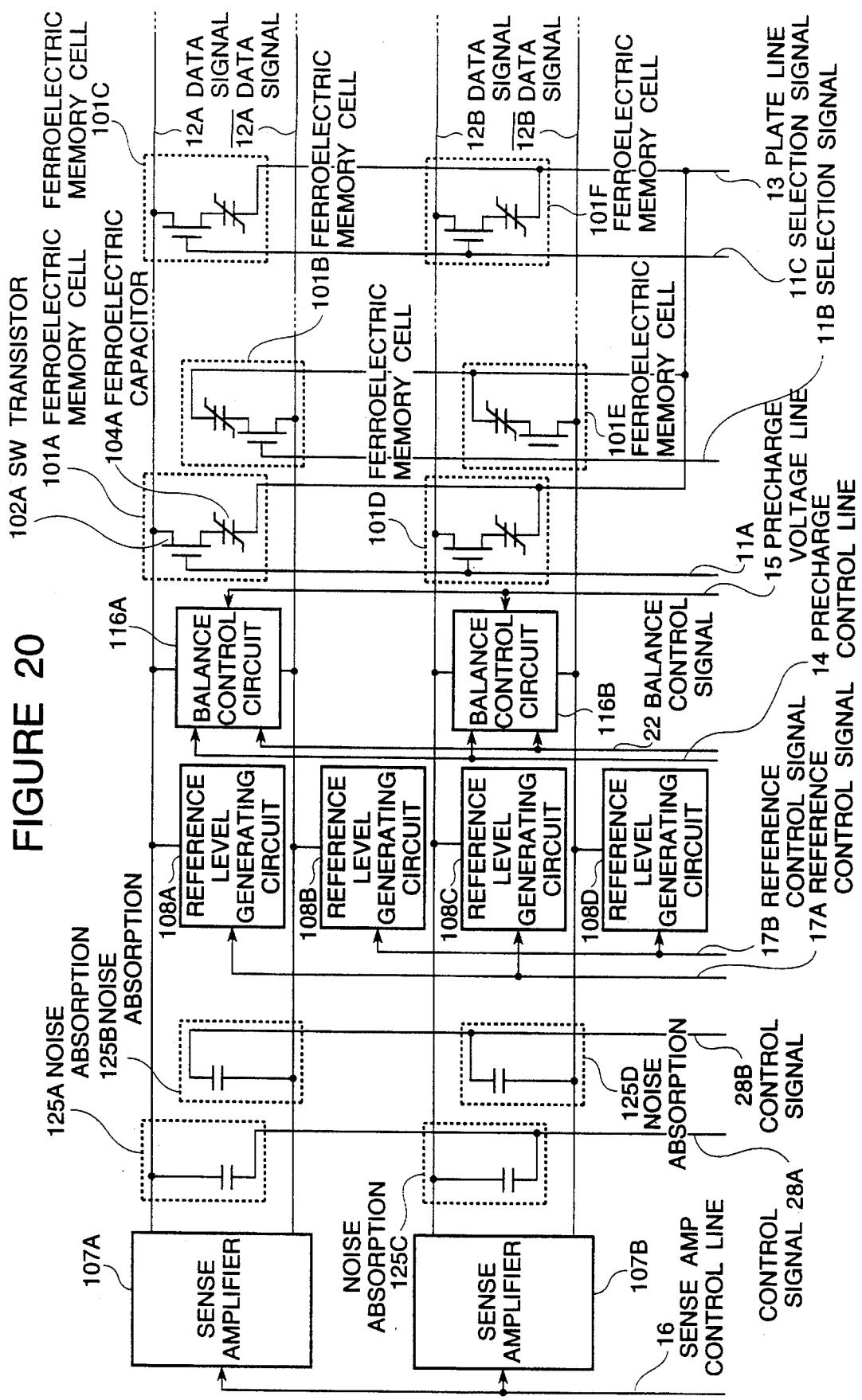
FIG. 20 is a circuit diagram of a third embodiment of the ferroelectric memory in accordance with the present invention, provided with a coupling capacitor connected to the data signal line.
Figure 21:
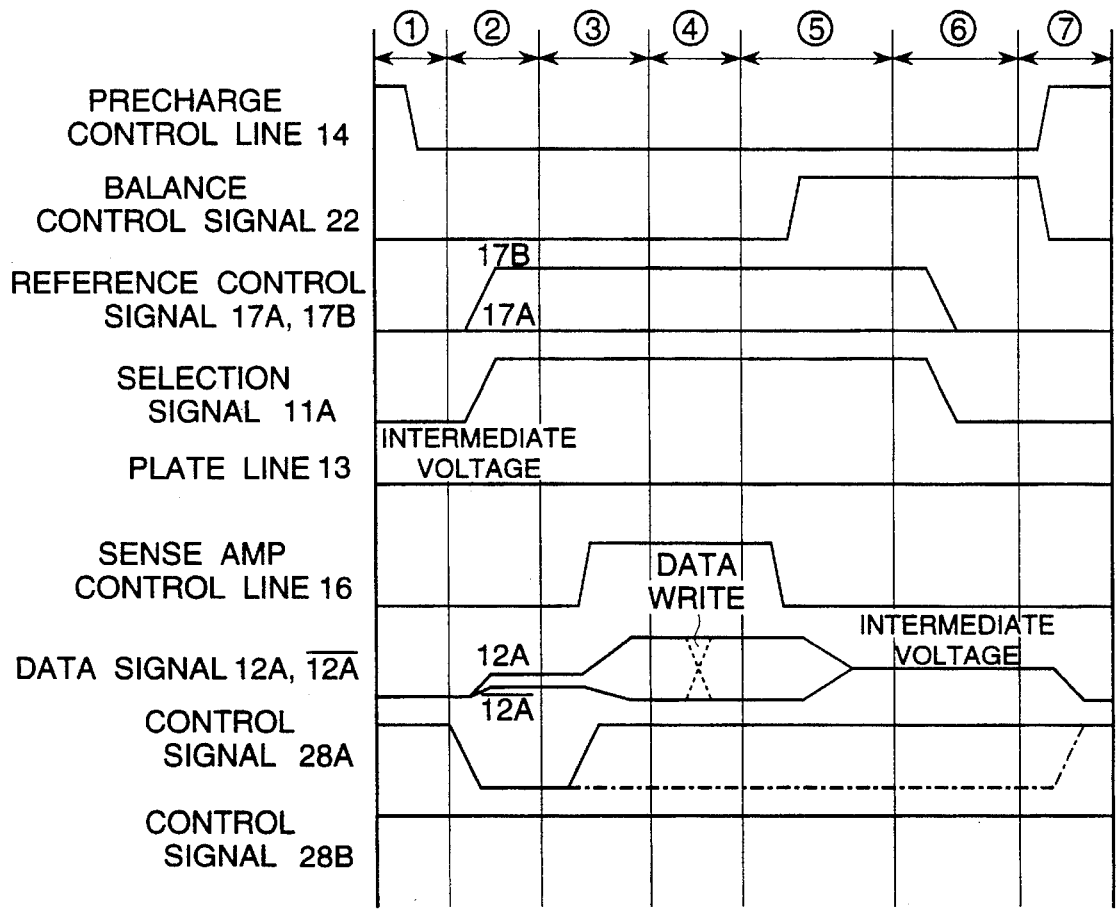
FIG. 21 is a timing chart illustrating an operation of the ferroelectric memory shown in FIG. 20.

Referring to FIG. 20, there is shown a circuit diagram of the third embodiment of the present invention, in which the noise absorbing circuit 125A to 125D shown in FIG. 18 are incorporated into the plate non-drive type ferroelectric memory shown in FIGS. 11 and 12. FIG. 21 is the timing chart illustrating the operation of the ferroelectric memory shown in FIG. 20. The method for controlling the data signal line voltage variation suppressing circuit control signal lines 28A and 28B is the same as that in FIG. 19.

Figure 22:
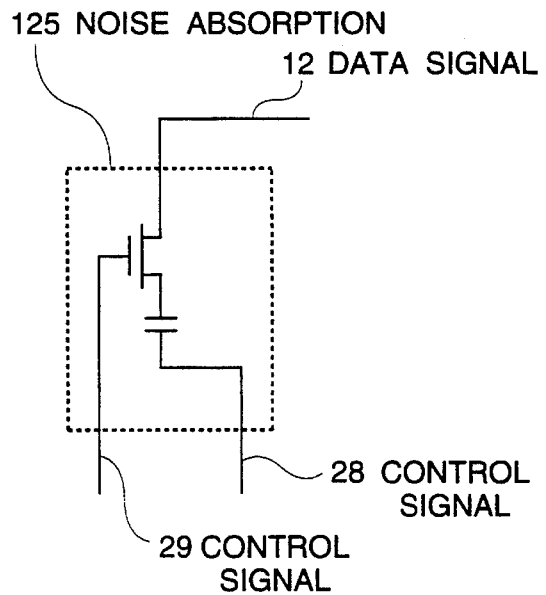
FIG. 22 is a circuit diagram of a data signal line voltage variation suppressing circuit composed of a transistor and a capacitor, which is used in a fourth embodiment of the ferroelectric memory in accordance with the present invention.
Figure 23:
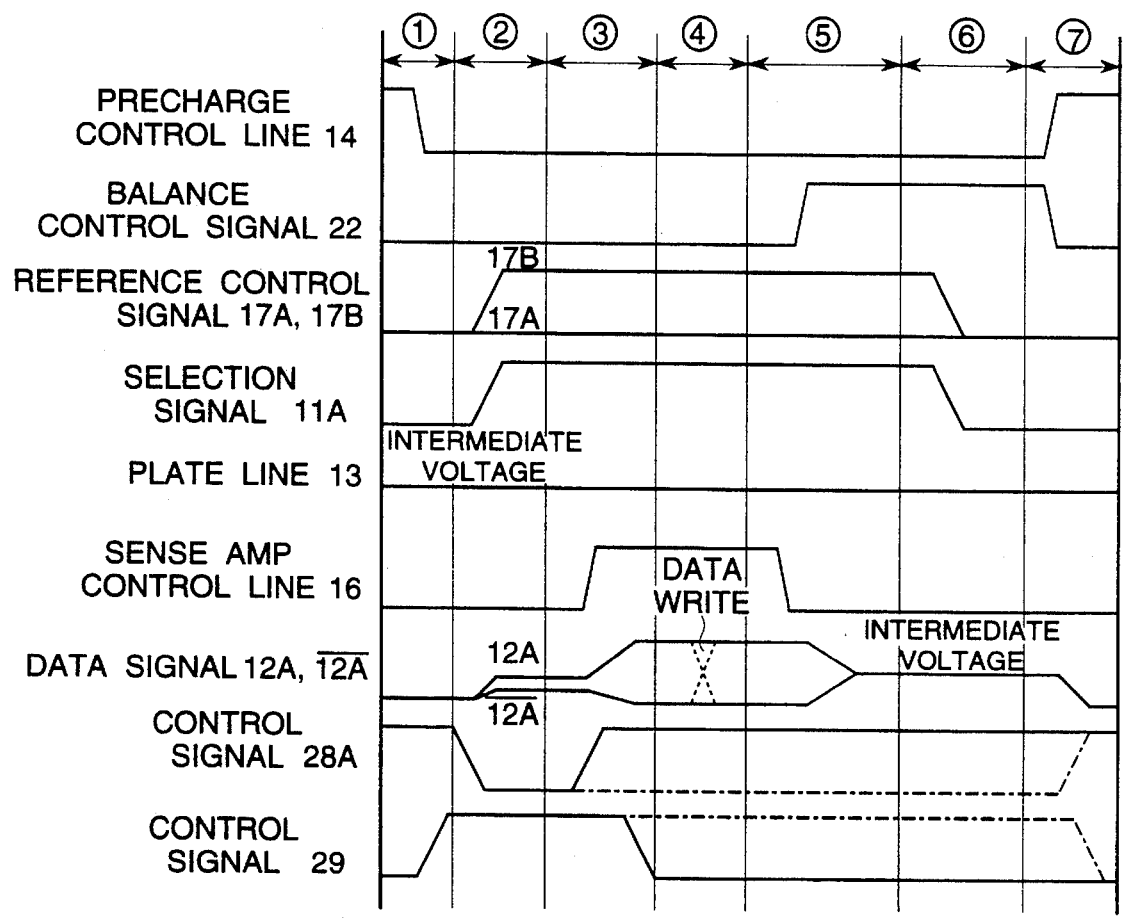
FIG. 23 is a timing chart illustrating an operation of the ferroelectric memory shown in FIG. 22.

As the noise absorbing means shown in FIGS. 18 and 20, it is possible to use a circuit composed of a transistor and a capacitor, as shown in FIG. 22. FIG. 23 shows the timing chart illustrating the operation of the fourth embodiment in which the circuit shown in FIG. 22 is provided, the noise absorbing means, in the plate non-drive type ferroelectric memory shown in FIG. 20. The method for controlling the data signal line voltage variation suppressing circuit control signal lines 28A and 28B is the same as that in FIGS. 19 and 21. Furthermore, a gate of the transistor is connected to a data signal line voltage variation suppressing circuit gate control signal line 29, so that the connection and disconnection between the capacitor and the data signal line are controlled by this gate control signal line 29. In FIG. 23, the solid line and the one-dot chain line of the control signal line 28A and the gate control signal line 29, indicates that it is sufficient if the rising of the control signal line 28A and the falling of the gate control signal line 29 are between the timing indicated by the solid line and the timing indicated by the one-dot chain line.

As the capacitor shown in FIG. 22, it is possible to use a ferroelectric capacitor. In addition, one or more memory cells can be used as the noise absorbing circuit.

Figure 24:
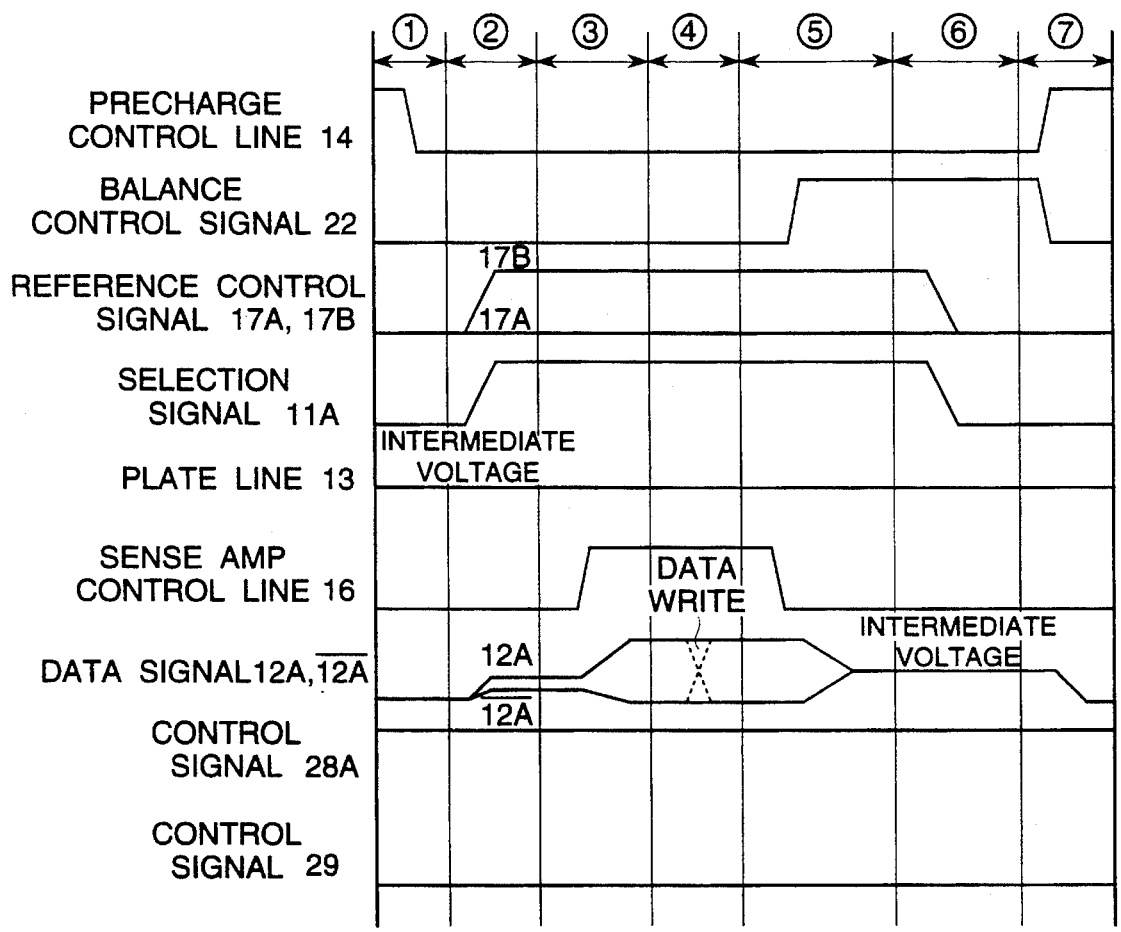
FIG. 24 is a timing chart illustrating an operation of the ferroelectric memory, for illustrating a fifth embodiment of the present invention.
Figure 25:
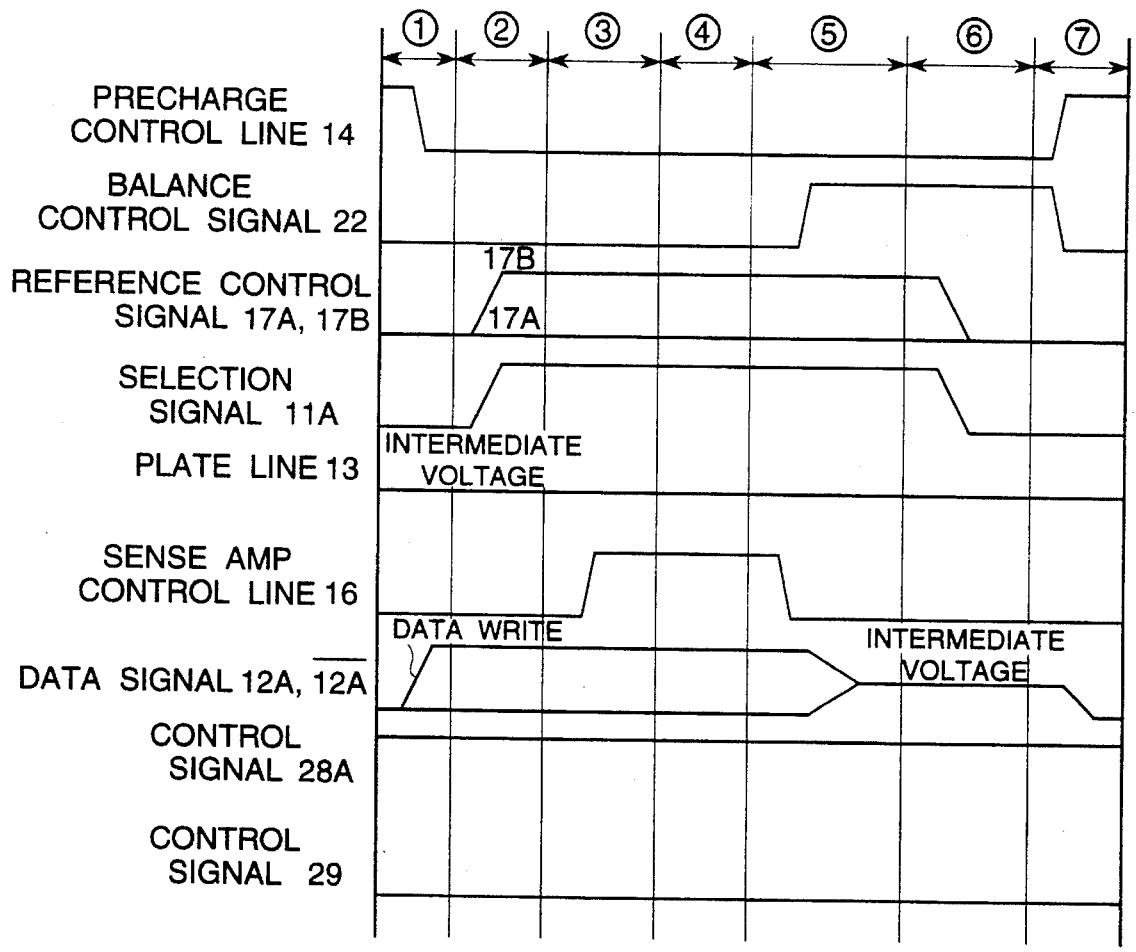
FIG. 25 is a timing chart illustrating an operation of the ferroelectric memory, for illustrating a sixth embodiment of the present invention.

The operation of the noise absorbing circuit 125 in the present invention is required when the data is read out from the ferroelectric memory cell, but is not required when the data is written to the memory cell. Therefore, when the data is written to the memory cell, the control signal 29 is maintained at the low level so as to maintain the noise absorbing circuit 125 in a deactivated condition, as shown in FIG. 24 illustrating the fifth embodiment of the present invention. In this embodiment, the reading operation is performed during a period (2) in FIG. 24, and there is possibility that the data read out at that time is not normal. However, this is not problem, since the data read out is not used, and data supplied from an external at a later stage is written to the memory cell. In addition, as shown in FIG. 25 illustrating the sixth embodiment of the present invention, it is possible to previously set on the data signal lines 12A and /12A a voltage corresponding to the data to be written.

Figure 26:
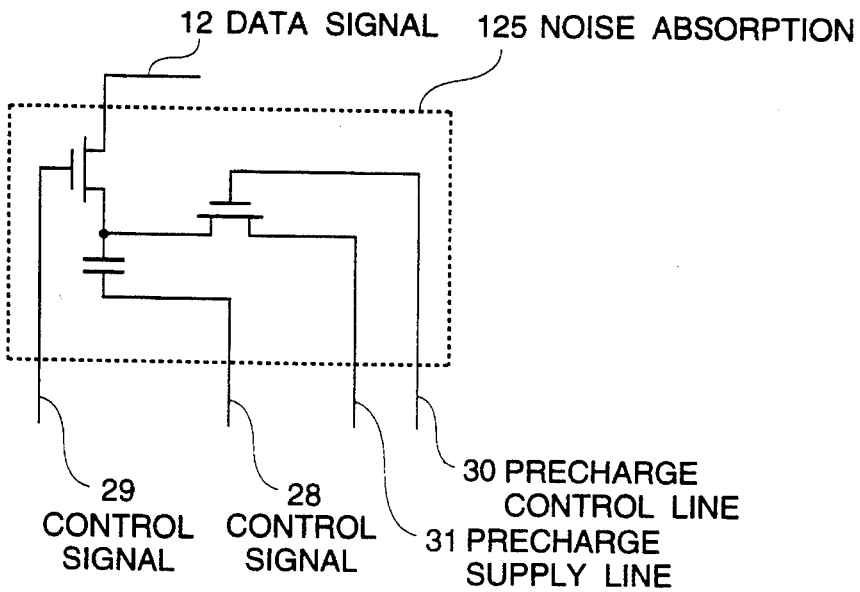
FIG. 26 is a circuit diagram of the circuit shown in FIG. 22 which is composed of the transistor and the capacitor and which is added with a precharge transistor.

Referring to FIG. 26, there is shown a modified noise absorbing circuit, in which a connection node between the transistor and the capacitor shown in FIG. 22 can be precharged to a voltage of a data signal line voltage variation suppressing circuit precharging power supply line 31, through a transistor having a gate connected to a data signal line voltage variation suppressing circuit precharging control signal line 31. With this arrangement, it is possible to set the voltage of the connection node in a standby condition, and therefore, it is possible to enlarge the range of noise voltage which can be absorbed.

Figure 27:
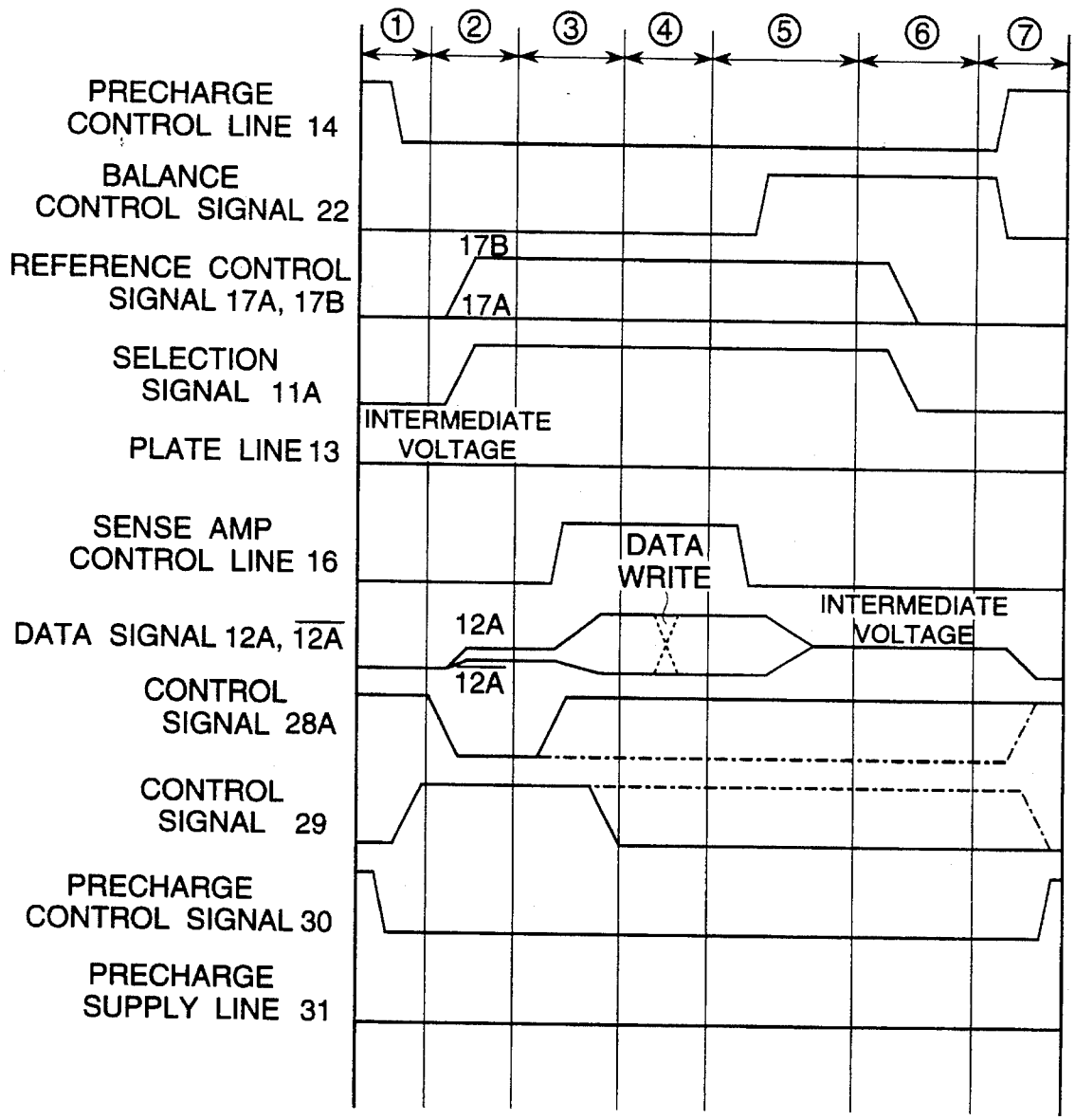
FIG. 27 is a timing chart illustrating an operation of the ferroelectric memory in combination with the circuit shown in FIG. 26.

FIG. 27 shows the timing chart illustrating the operation of the second embodiment of the ferroelectric memory in accordance with the present invention, using the circuit shown in FIG. 26 as the noise absorbing circuit.

Figure 28A:
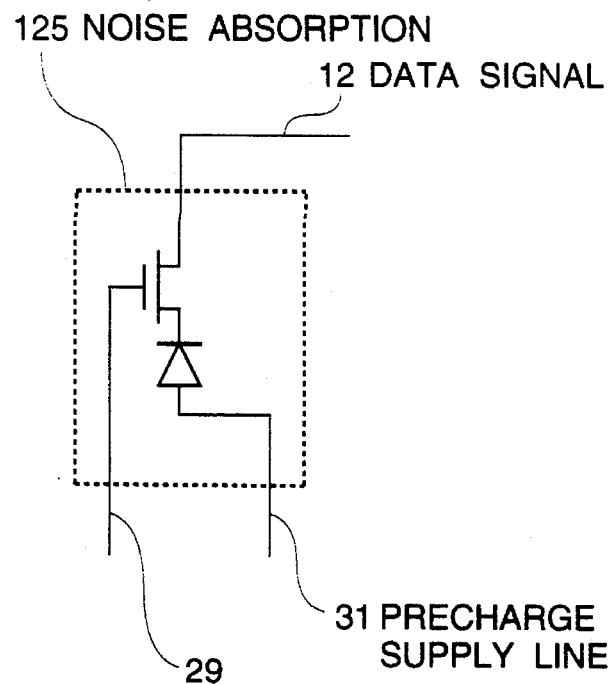
FIGS. 28A and 28B are a circuit diagram of a data signal line voltage variation suppressing circuit composed of a transistor and a diode, which is used in an eighth embodiment of the ferroelectric memory in accordance with the present invention.
Figure 28B:
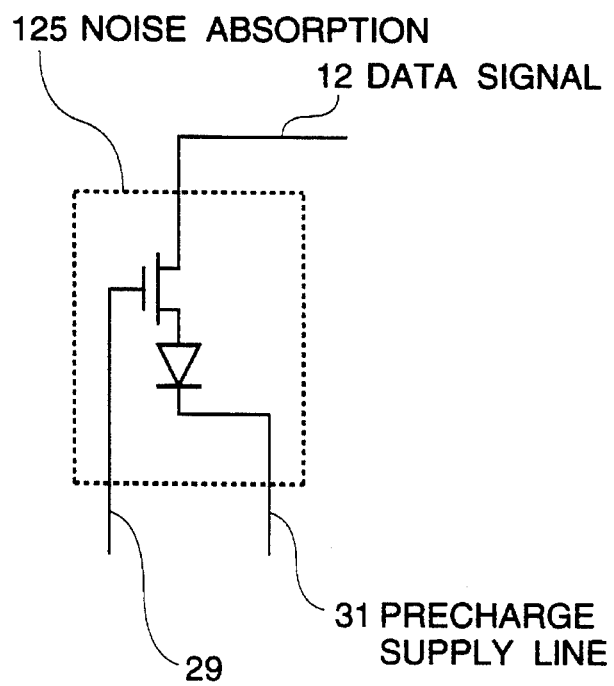

In place of the capacitor shown in FIGS. 18, 20, 22 and 26, it is possible to use a diode. FIGS. 28A and 28B illustrate a circuit using the diode as the noise absorbing circuit, which is the eighth embodiment of the present invention.

Figure 29:
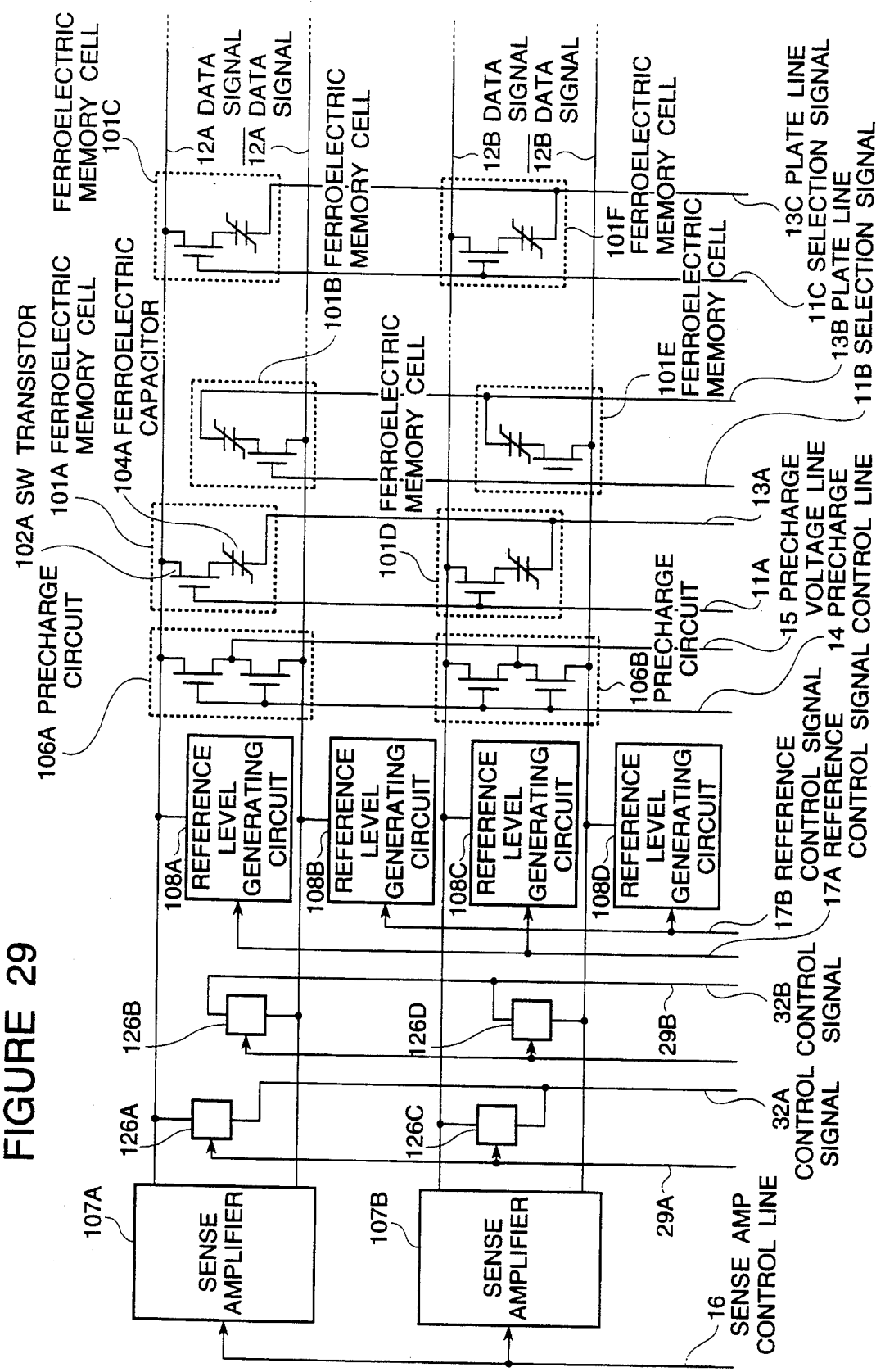
FIG. 29 is a circuit diagram of a ninth embodiment of the ferroelectric memory in accordance with the present invention, in which a constant voltage source or a constant current source is connected to the data signal line.
Figure 30:
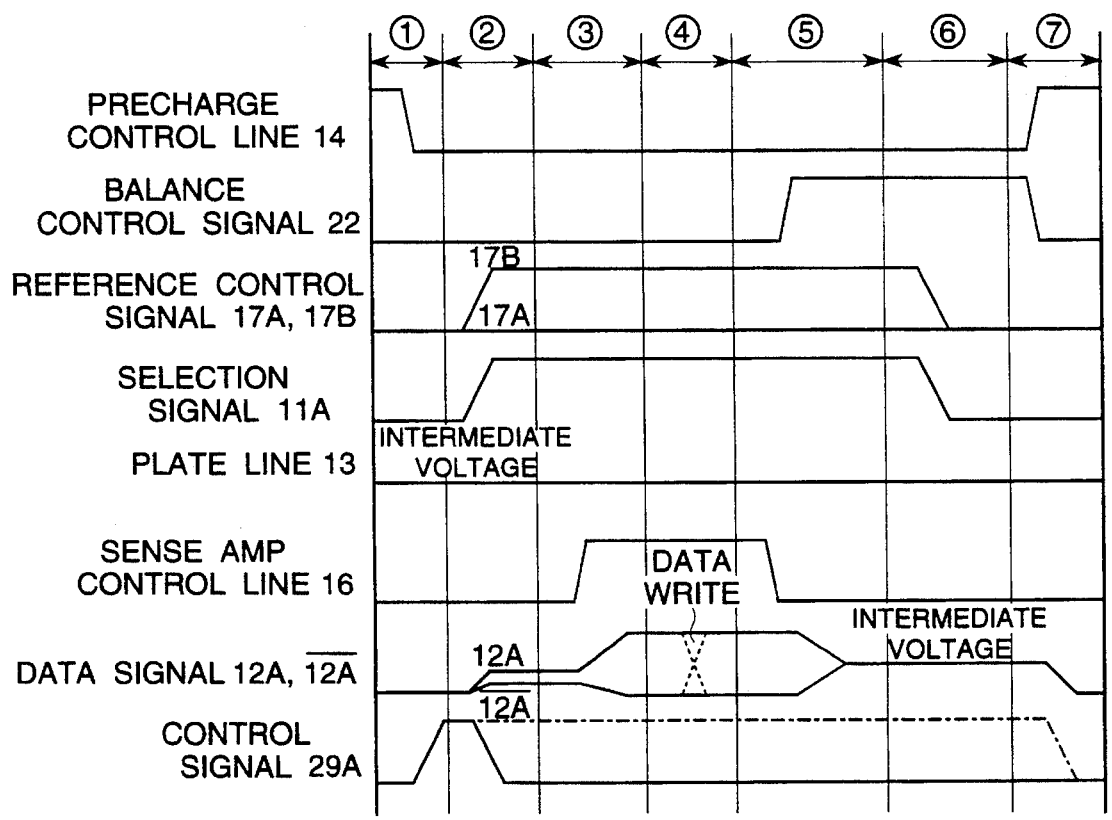
FIG. 30 is a timing chart illustrating a data writing operation of the ferroelectric memory shown in FIG. 29.

Furthermore, as shown in FIG. 29, to the data signal lines 12A, /12A, 12B and /12B, are connected constant voltage sources or constant current sources 126A to 126D controlled by data signal line voltage variation suppressing circuit gate control signal lines 29A and 29B, for the purpose of absorbing the above mentioned noise. This is the ninth embodiment of the present invention. FIG. 30 shows the timing chart illustrating the operation of the ninth embodiment. The constant voltage sources or constant current sources 126A to 126D are controlled by the gate control signal lines 29A and 29B, similarly to the gate control signal line 29 in FIG. 23.

Figure 31:
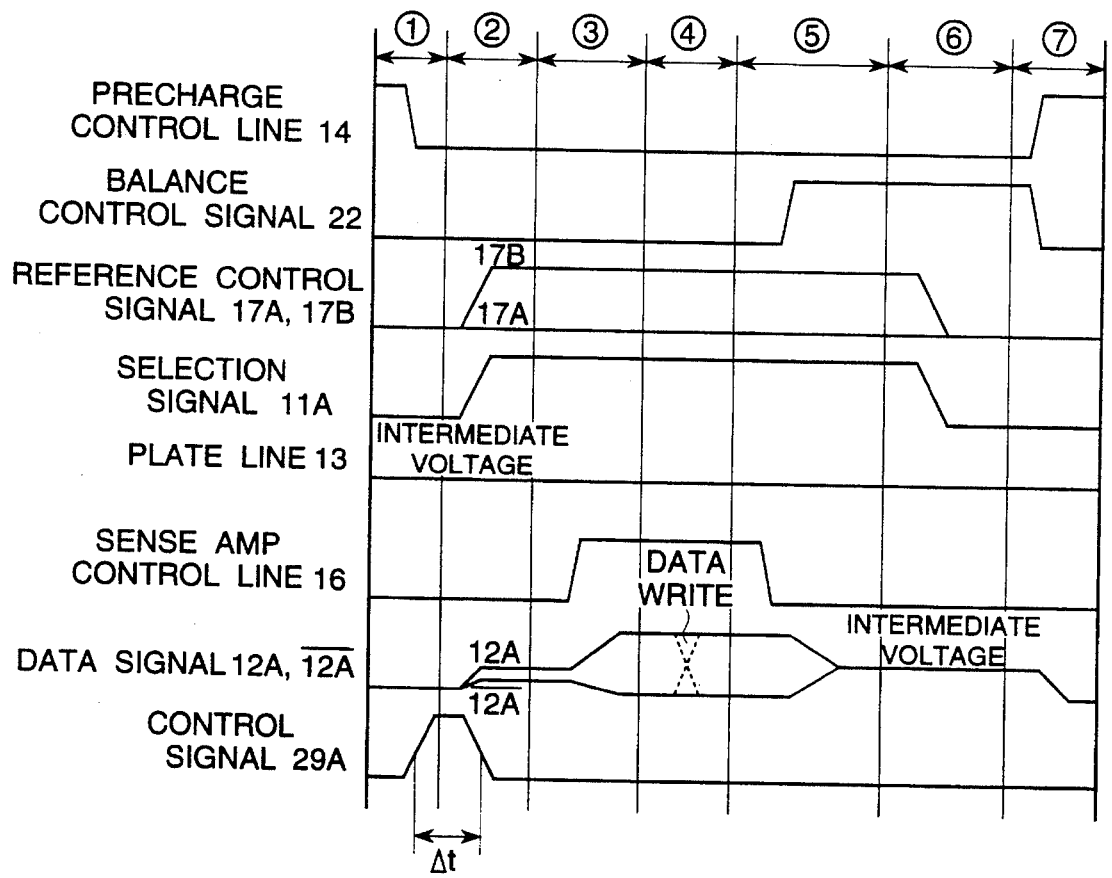
FIG. 31 is a timing chart illustrating an operation of the ferroelectric memory, for illustrating a tenth embodiment of the present invention.

Furthermore, as shown in FIG. 31 illustrating the tenth embodiment of the present invention, if the activated time of the constant voltage sources or constant current sources 126A to 126D shown in FIG. 29 is adjusted by a high level period Δt of the gate control signal 29A, it is possible to absorb the noise electric charge just outputted to the data signal line.

Figure 32:
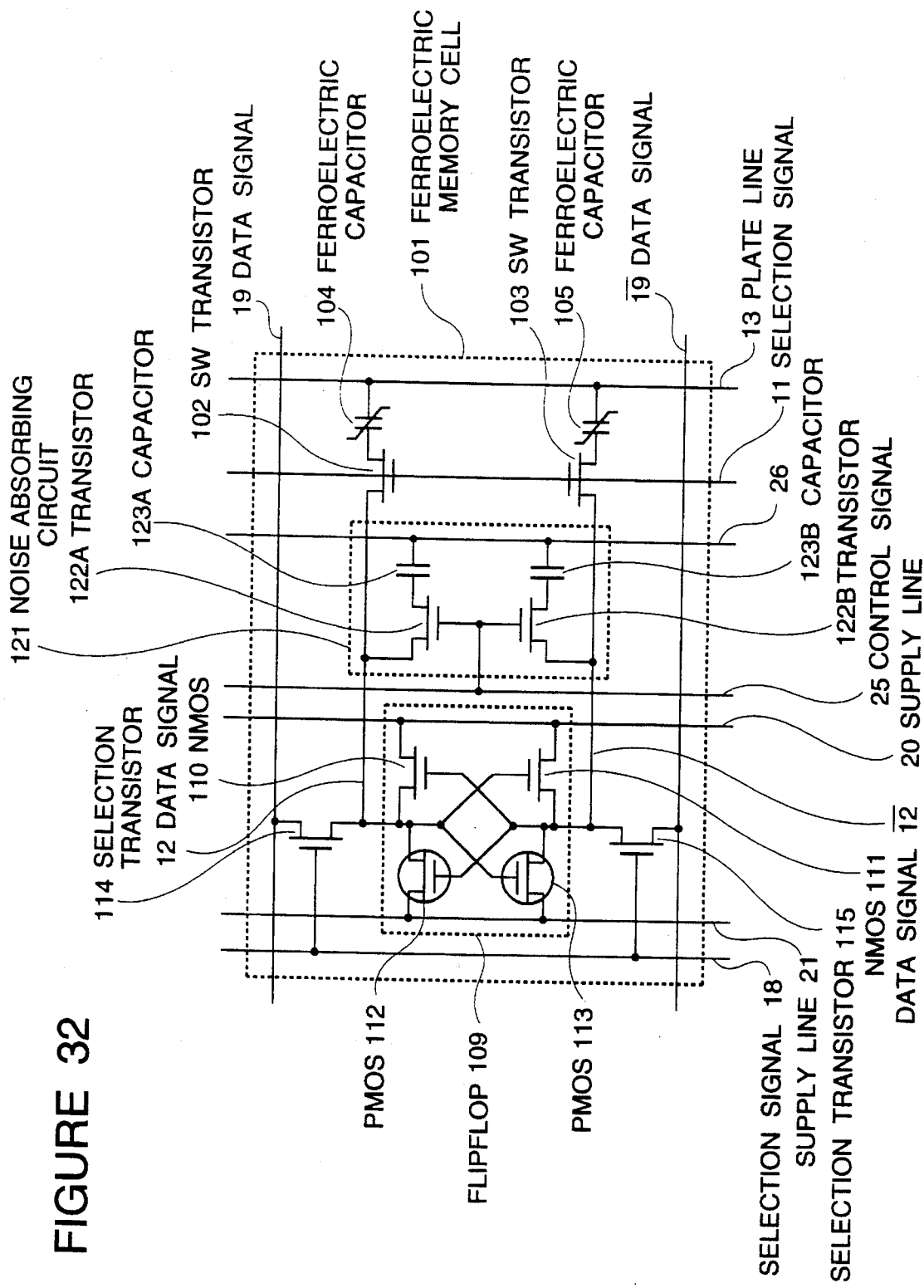
FIG. 32 is a circuit diagram of an eleventh embodiment of the ferroelectric memory in accordance with the present invention, which is a "SRAM+ferroelectric memory cell" type memory.

Referring to FIG. 32, there is shown a circuit diagram of an eighth embodiment of the ferroelectric memory in accordance with the present invention, which is a "SRAM+ferroelectric memory cell" type memory. As seen from FIG. 32, a noise absorbing circuit 121 composed of transistors 122A and 122B and capacitors 123A and 123B is connected to data signal nodes 12 and /12 in the memory cell. This noise absorbing circuit 121 can be connected as shown in FIG. 33, which illustrates the twelfth embodiment of the present invention.

Figure 9:
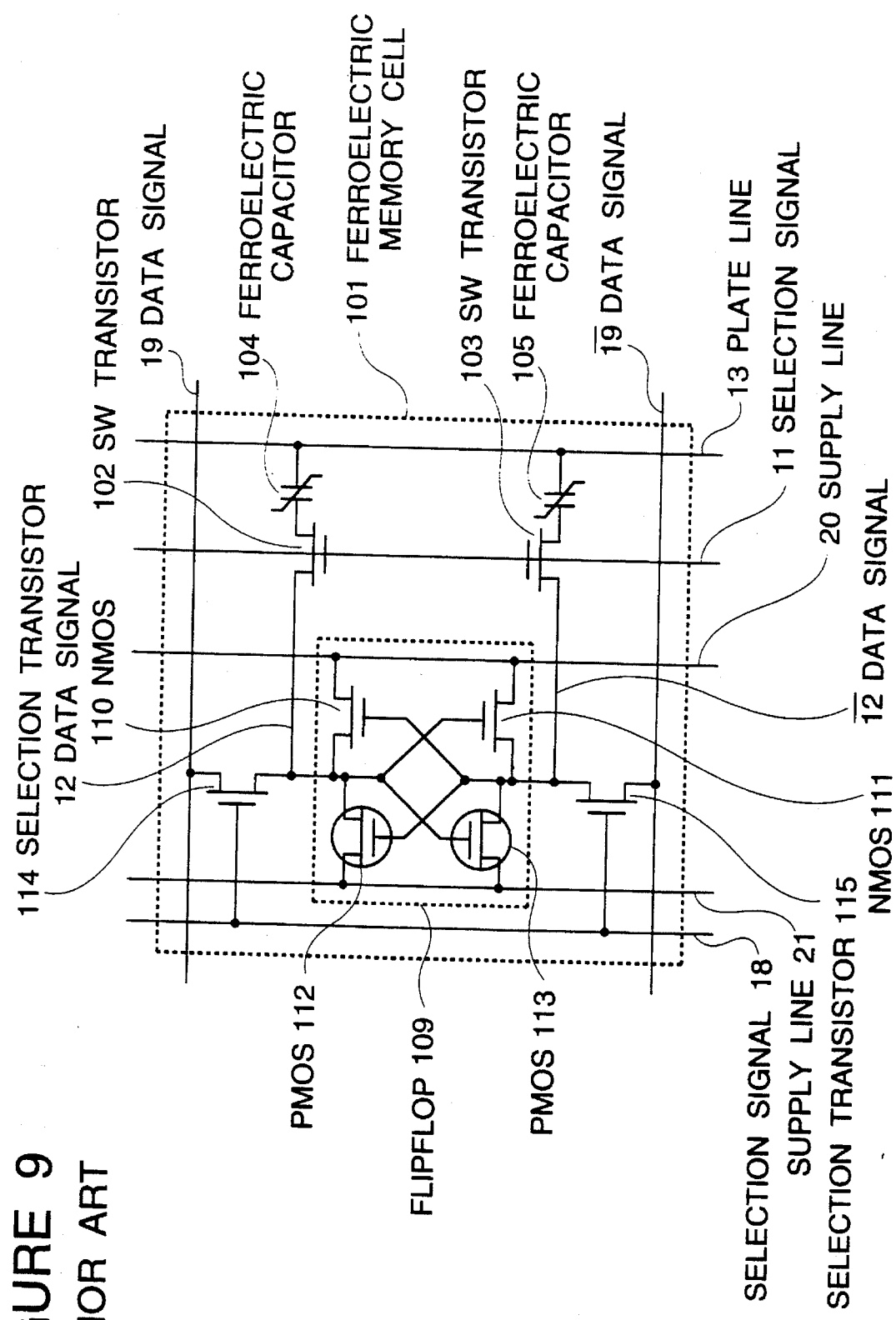
FIG. 9 is a circuit diagram of one memory cell of the "SRAM+ferroelectric memory cell" memory.
Figure 10:
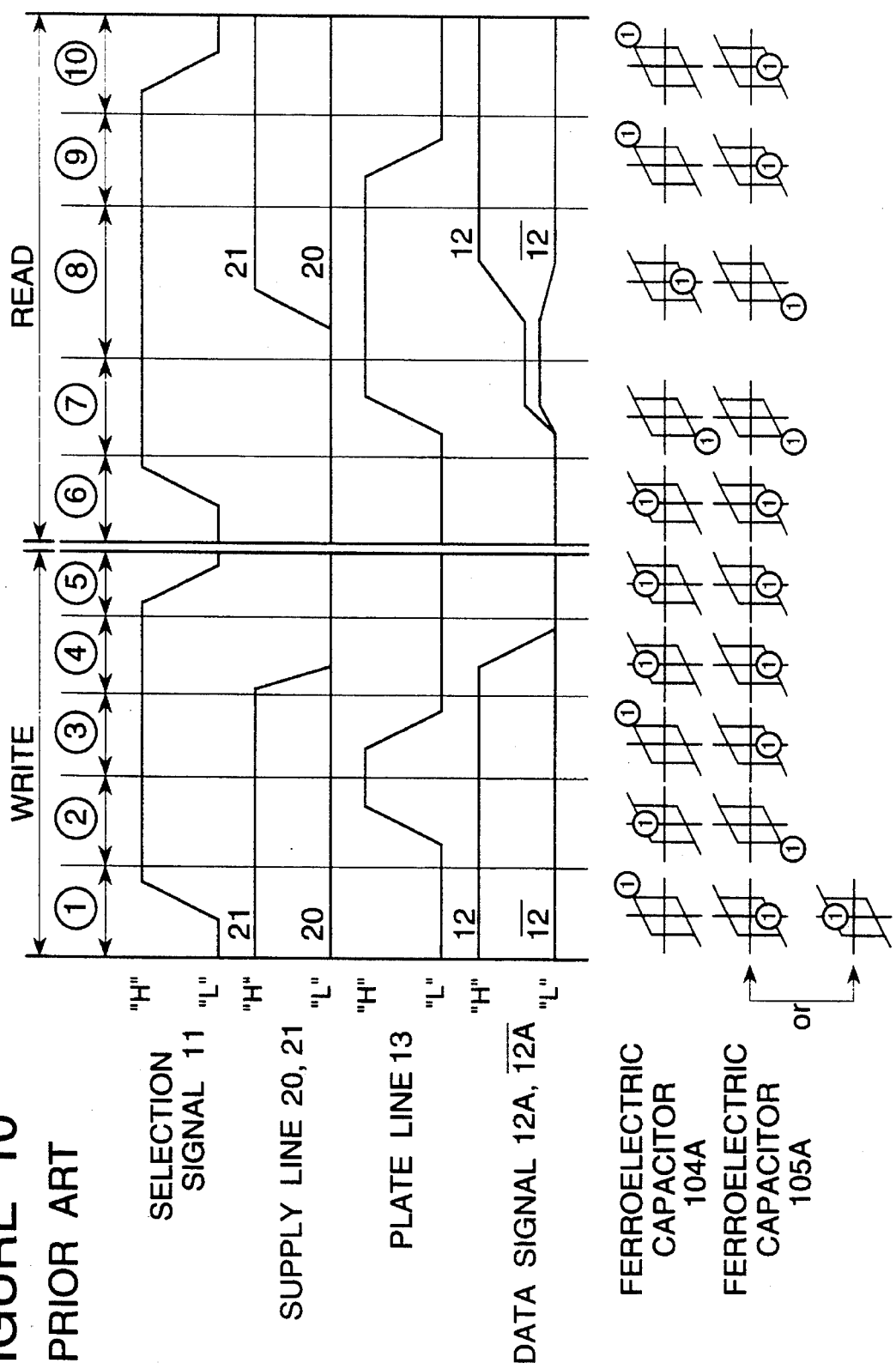
FIG. 10 is a timing chart illustrating an operation of the memory cell shown in FIG. 9.
Figure 33:
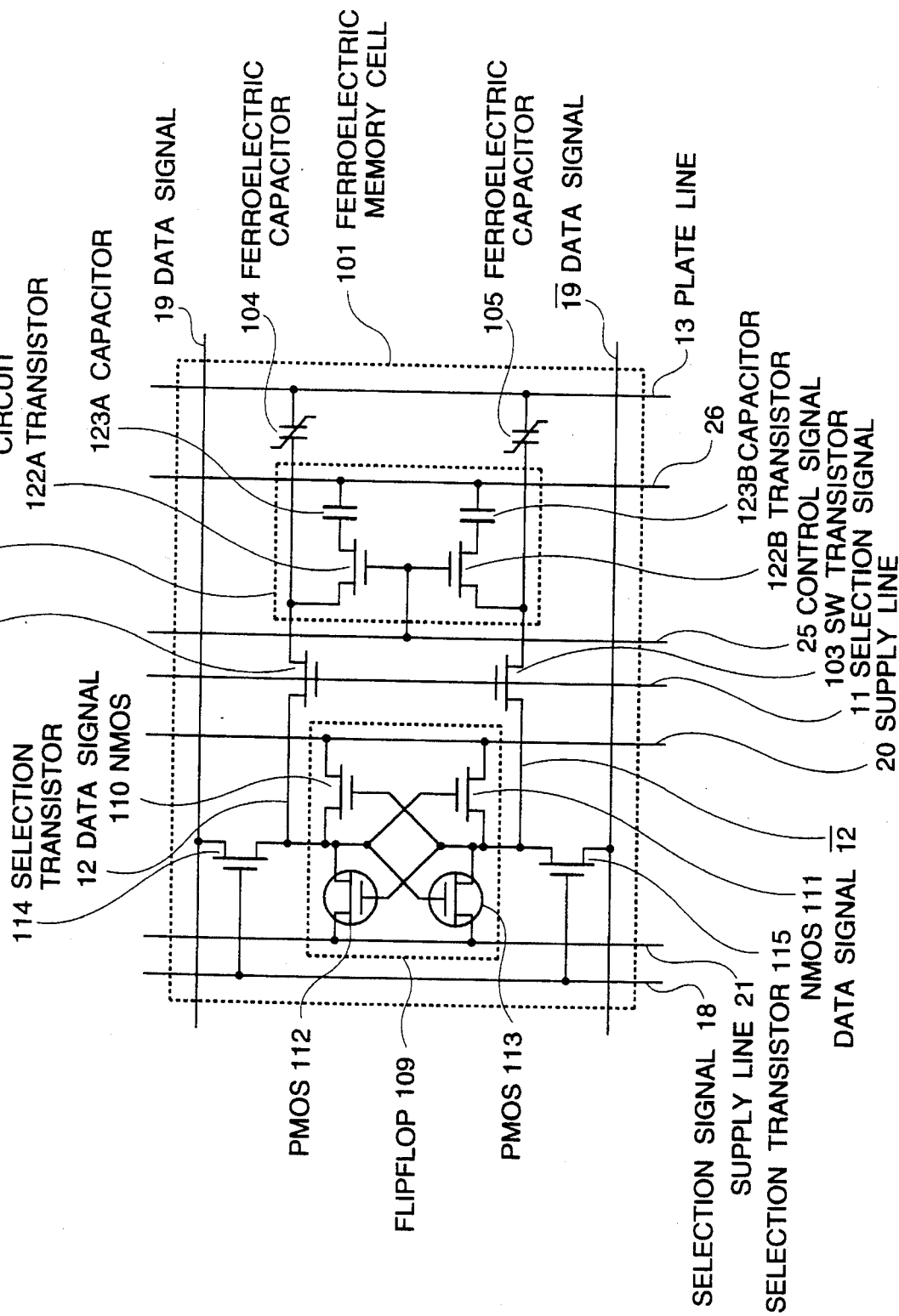
FIG. 33 is a circuit diagram of a twelfth embodiment of the ferroelectric memory in accordance with the present invention, which is a "SRAM+ferroelectric memory cell" type memory.
Figure 34:
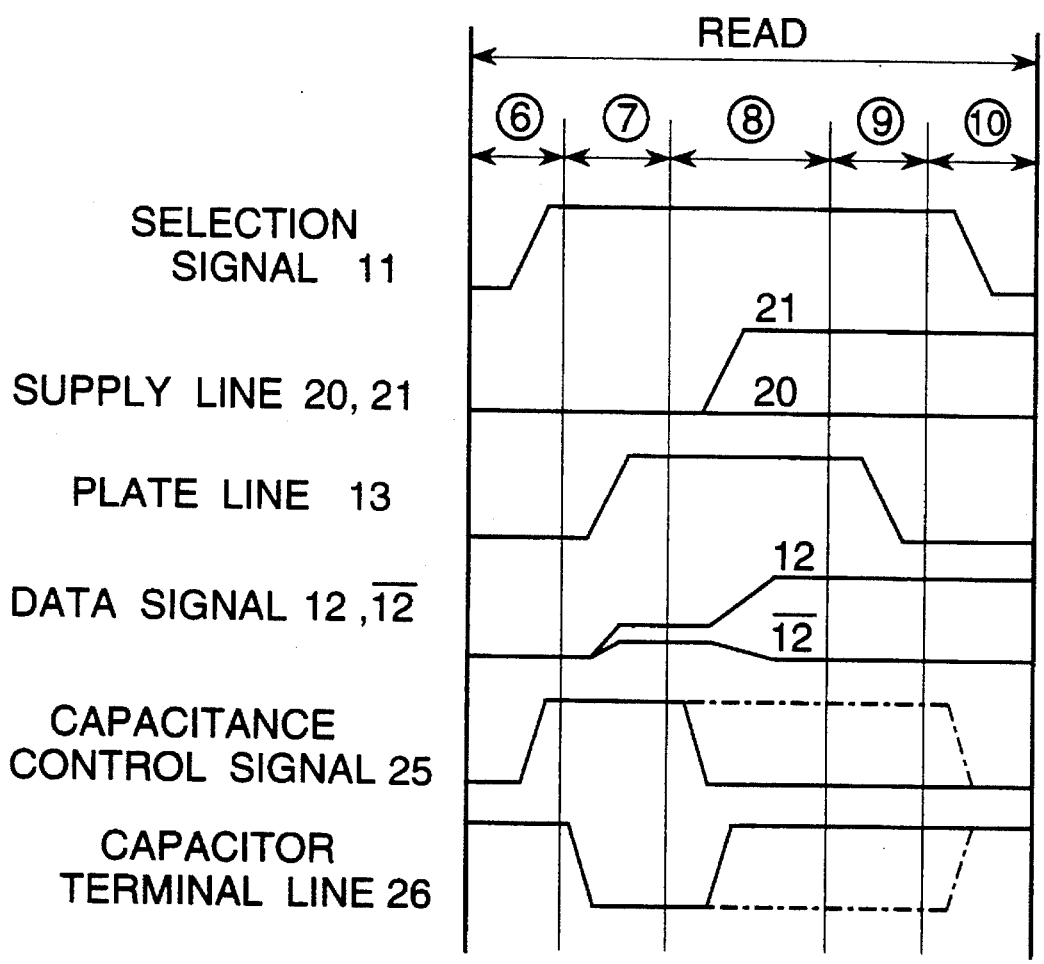
FIG. 34 is a timing chart illustrating an operation of the memory shown in FIGS. 29 and 30.

Referring to FIG. 34 is a timing chart illustrating an operation of the memory shown in FIGS. 32 and 33. The operation of the control signals 25 and 26 for the noise absorbing circuit 121 is added to the operation of the conventional "SRAM+ferroelectric memory cell" type memory shown in FIGS. 9 and 10. The operation timing of the control signals 25 and 26 is similar to that shown in FIG. 23.

Figure 35:
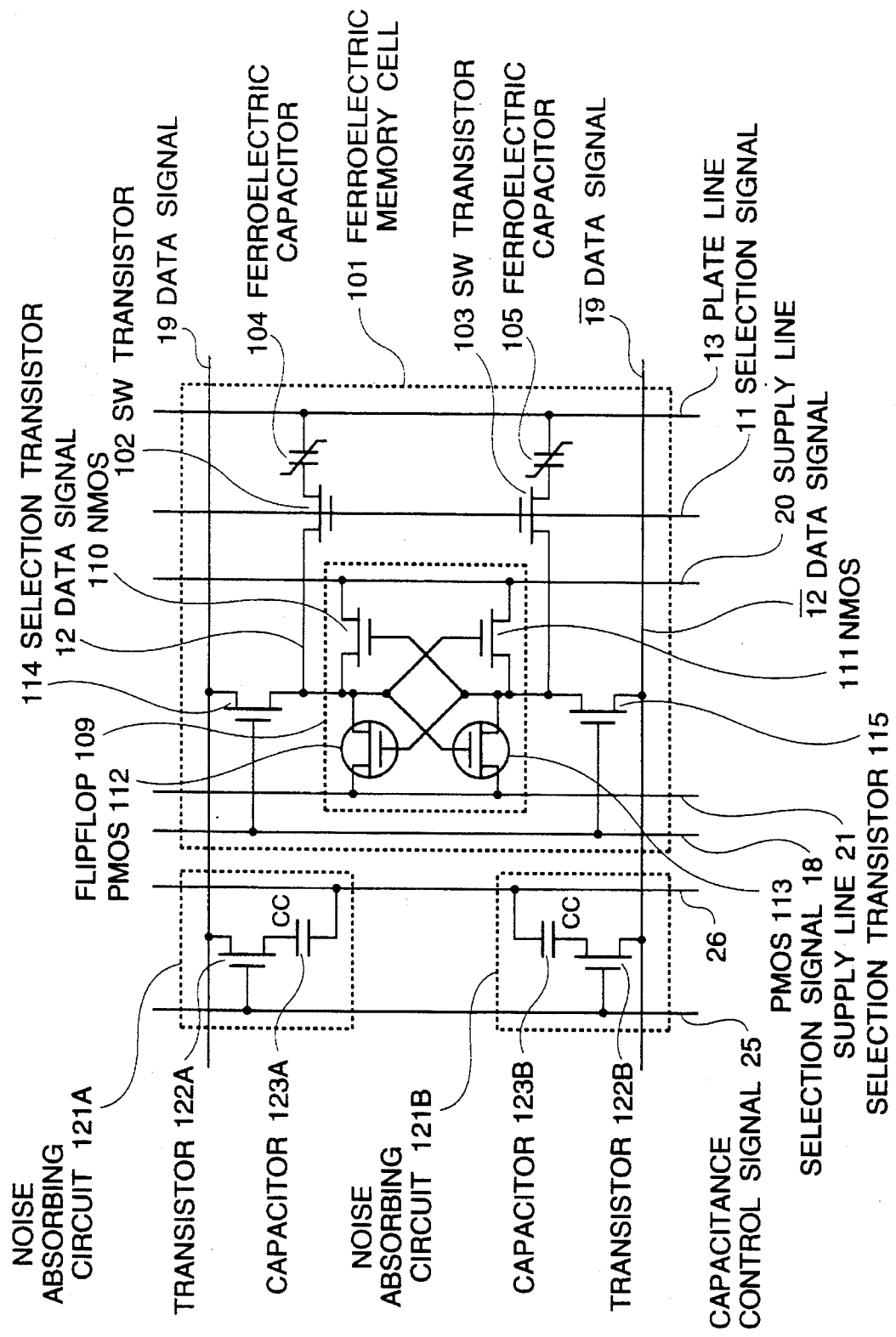
FIG. 35 is a circuit diagram of a thirteenth embodiment of the ferroelectric memory in accordance with the present invention, which is a "SRAM+ferroelectric memory cell" type memory.
Figure 36:
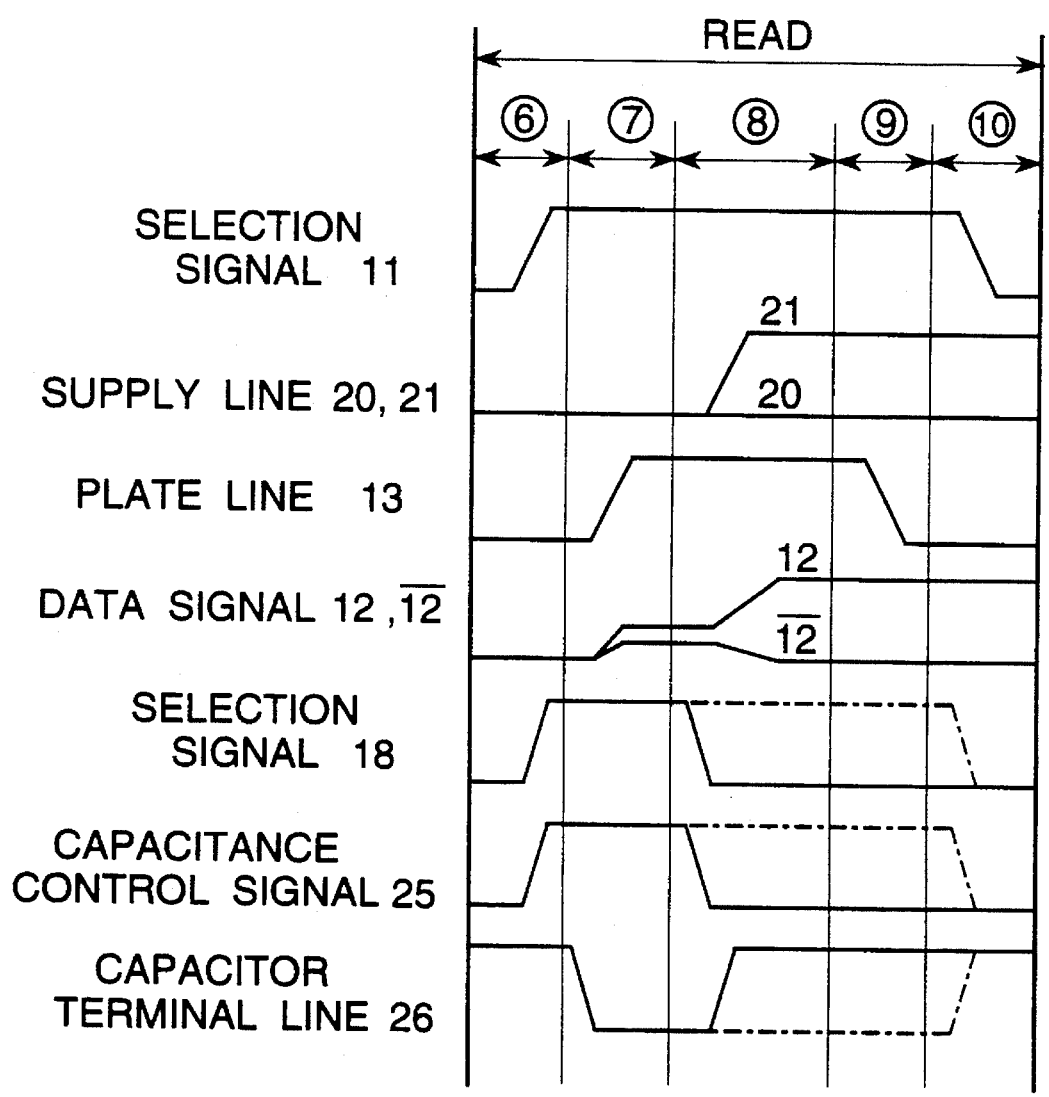
FIG. 36 is a timing chart illustrating an operation of the memory shown in FIG. 35.

In place of connecting each one noise absorbing circuit 121 to each one memory cell, it is possible to connect each one noise absorbing circuit 121 to each data signal line 19 and /19 for the SRAM, as shown in FIG. 35, which illustrates a thirteen embodiment of the present invention, which is a "SRAM+ferroelectric memory cell" type memory. This arrangement is effective in reducing the required chip area. FIG. 36 is a timing chart illustrating an operation of the memory shown in FIG. 35. When the data is read out from the ferroelectric capacitor 104 and 105 to the flipflop 109, the selection signal 18 for the SRAM is brought to the high level, and a data signal line voltage variation suppressing circuit control signal 25 and a data signal line voltage variation suppressing circuit internal capacitor terminal line 26 are controlled similarly to the manner explained until now. Thus, the noise can be absorbed.

Figure 37:
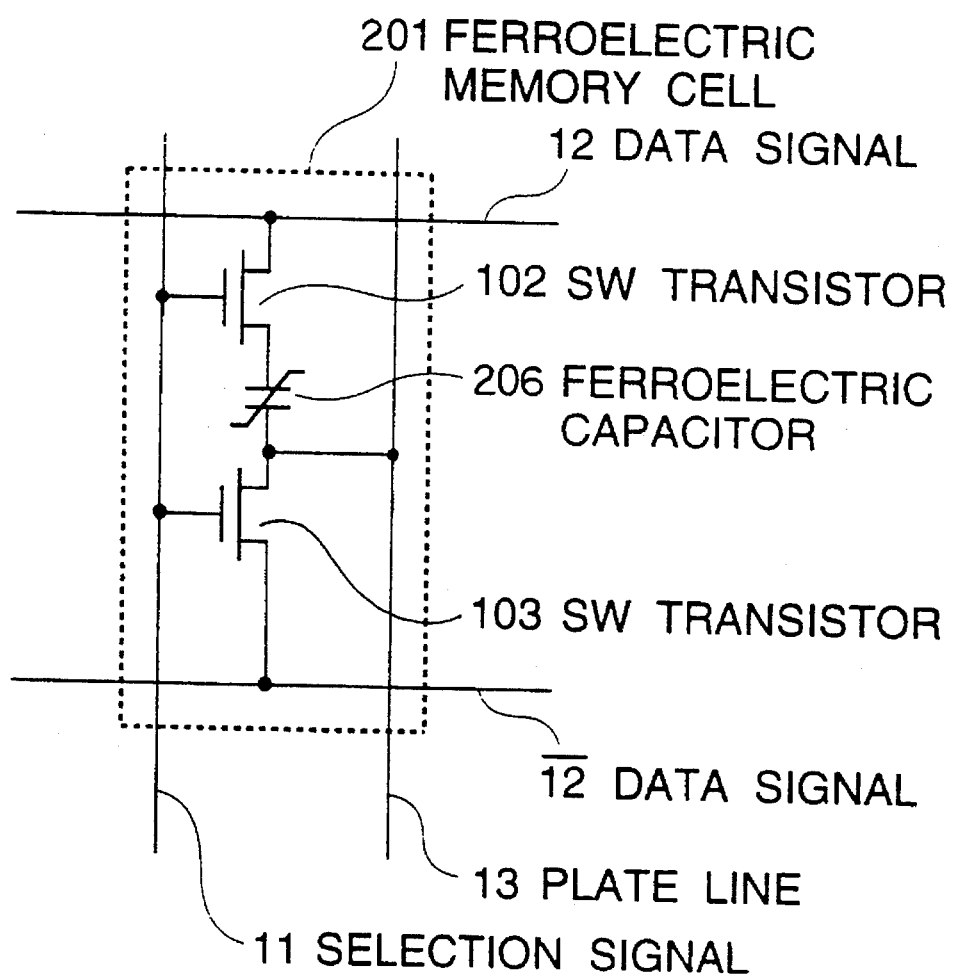
FIG. 37 is a circuit diagram of another type of memory cell that can be used in accordance with the various embodiments of the present invention.

FIG. 37 in the application shows a further embodiment of a memory cell which can be used with various ones of the above-described embodiments, in which first and second transistors 102, 103 have a ferroelectric capacitor 206 connected between their respective sources. A drain of transistor 102 is connected to one signal line 12 of a pair of data signal lines 12, $\overline{12}$, and a gate of transistor 102 is connected to selection signal line 11. A drain of transistor 103 is connected to the other signal line $\overline{12}$ of the pair, and a gate of transistor 103 is connected to selection signal line 11.

In the above mentioned embodiments, the 1T/1C type memory cell and the "SRAM+ferroelectric memory cell" type have been used as the memory cell, but the present invention is no limited to only these types of memory. The present invention can be similarly applied to all ferroelectric memories having such an operating system in which when a voltage is applied between opposing electrodes of the ferroelectric capacitor in order to read out the data from the ferroelectric memory cell, a voltage variation occurs on a node connected to the electrode of the ferroelectric capacitor, and the voltage variation is a problem. The above mentioned embodiments can be selectively combined to realize the memory which can realize the present invention.

As seen from the above, the ferroelectric memory in accordance with the present invention can avoid the problem of the prior art in which when the data is read out from the memory cell, the voltage of the data signal line varies, so that a voltage not smaller than the coercive voltage is not applied between the opposing electrodes of the ferroelectric capacitor, with the result that a sufficient read-out signal voltage cannot be obtained. Therefore, a stable operation of the ferroelectric memory can be realized.

The invention has thus been shown and described with reference to the specific embodiments. However, it should be noted that the present invention is in no way limited to the details of the illustrated structures but changes and modifications may be made within the scope of the appended claims.

What is claimed is:

1. A ferroelectric memory comprising, a plurality of pairs of data signal lines for outputting and receiving data, a plurality of selection signal lines selected in accordance with an address signal, and a plurality of unitary memory cell arrays each arranged along a corresponding one pair of data signal lines of said plurality of pairs of data signal lines, each of said unitary memory cell arrays including:

a plurality of memory cells each including a ferroelectric capacitor having a capacitor dielectric composed of a ferroelectric material and sandwiched between a pair of opposing electrodes, a switching means connected to said ferroelectric capacitor and one of said corresponding pair of data signal lines, and controlled by a corresponding one of said selection signal lines, so that different polarized conditions of said ferroelectric capacitor correspond to different conditions of stored data, respectively, and when a first voltage, which is not zero, is applied between the opposing electrodes of said ferroelectric capacitor, since a current flowing between said ferroelectric capacitor and the corresponding data signal line is different dependently upon the polarized condition of said ferroelectric capacitor, the current is detected or a voltage appearing on the corresponding pair of data signal lines due to the current is detected for the purpose of reading out the stored data;

a means connected to the corresponding one pair of data signal lines, for detecting a current or voltage difference appearing between the corresponding pair of data signal lines; and a means connected to at least one of the corresponding pair of data signal lines, for absorbing, when data is read out from a memory cell by setting the selection signal line to a sufficient voltage for putting the memory cell in a selected condition, electric charges flowing into the at least one of the corresponding pair of data signal lines, because of factor other than the current caused due to the polarization of the ferroelectric capacitor, whereby a voltage not smaller than the coercive voltage of the ferroelectric capacitor can be applied between the opposing electrodes of the ferroelectric capacitor.

2. A ferroelectric memory claimed in claim 1 wherein said memory cell includes at least one ferroelectric capacitor and at least one transistor.

3. A ferroelectric memory claimed in claim 1 wherein said memory cell includes at least one ferroelectric capacitor and at least one transistor, first and second opposing electrodes of said at least one ferroelectric capacitor being connected to a source of said at least one transistor and a plate line, a drain of said at least one transistor being connected to said one of said corresponding pair of data signal lines, and a gate of said at least one transistor being connected to said corresponding one of said selection signal lines.

4. A ferroelectric memory claimed in claim 1 wherein said memory cell includes first and second ferroelectric capacitors and first and second transistors, first and second opposing electrodes of said first ferroelectric capacitor being connected to a source of said first transistor and a plate line, a drain of said first transistor being connected to said one of said corresponding pair of data signal lines, and a gate of said first transistor being connected to said corresponding one of said selection signal lines, and first and second opposing electrodes of said second ferroelectric capacitor being connected to a source of said second transistor and said plate line, a drain of said second transistor being connected to the other of said corresponding pair of data signal lines, and a gate of said second transistor being connected to said corresponding one of said selection signal lines.

5. A ferroelectric memory claimed in claim 1 wherein said memory cell includes one ferroelectric capacitor and first and second transistors, first and second opposing electrodes of said ferroelectric capacitor being connected to a source of said first transistor and a source of said second transistor, respectively, a drain of said first transistor being connected to said one of said corresponding pair of data signal lines, and a gate of said first transistor being connected to said corresponding one of said selection signal lines, a drain of said second transistor being connected to the other of said corresponding pair of data signal lines, and a gate of said second transistor being connected to said corresponding one of said selection signal lines.

6. A ferroelectric memory claimed in claim 1 wherein said memory cell includes a flipflop and at least one ferroelectric capacitor, said flipflop being composed of a plurality of transistors or a combination of a plurality of transistors and passive circuit elements.

7. A ferroelectric memory claimed in claim 1 wherein said memory cell includes a flipflop and first and second ferroelectric capacitors, said flipflop being composed of a plurality of transistors or a combination of a plurality of transistors and passive circuit elements, two data signal terminals of said flipflop being respectively connected through first and second transfer gates to a pair of signal lines which are connected to a differential type sense amplifier, said data signal terminals of said flipflop being respectively connected through third and fourth transfer gates to a first electrode of said first and second ferroelectric capacitors, a control terminal of said first and second transfer gates being connected to said said corresponding one of said selection signal lines, a control terminal of said third and fourth transfer gates being connected to a control signal line, and a second electrode of said first and second ferroelectric capacitors being connected to a plate line.

8. A ferroelectric memory claimed in claim 1 wherein said electric charge absorbing means is composed of a capacitor connected to said at least one of the corresponding pair of data signal lines.

9. A ferroelectric memory claimed in claim 1 wherein said electric charge absorbing means is composed of a capacitor connected to said at least one of the corresponding pair of data signal lines through a transistor controlled by a control signal.

10. A ferroelectric memory claimed in claim 9 wherein a connection node between said capacitor and said transistor is connected to a precharge line through another transistor controlled by a precharge control signal.

11. A method for controlling an operation of a ferroelectric memory which comprises, a plurality of pairs of data signal lines for outputting and receiving data, a plurality of selection signal lines selected in accordance with an address signal, and a plurality of unitary memory cell arrays each arranged along a corresponding one pair of data signal lines of said plurality of pairs of data signal lines, each of said unitary memory cell arrays including:

a plurality of memory cells each including a ferroelectric capacitor having a capacitor dielectric composed of a ferroelectric material and sandwiched between a pair of opposing electrodes, a switching means connected to said ferroelectric capacitor and one of said corresponding pair of data signal lines, and controlled by a corresponding one of said selection signal lines, so that different polarized conditions of said ferroelectric capacitor correspond to different conditions of stored data, respectively, and when a first voltage, which is not zero, is applied between the opposing electrodes of said ferroelectric capacitor, since a current flowing between said ferroelectric capacitor and the corresponding data signal line is different dependently upon the polarized condition of said ferroelectric capacitor, the current is detected or a voltage appearing on the corresponding pair of data signal lines due to the current is detected for the purpose of reading out the stored data;

a means connected to the corresponding one pair of data signal lines, for detecting a current or voltage difference appearing between the corresponding pair of data signal lines; and a means connected to at least one of the corresponding pair of data signal lines, for absorbing, when data is read out from a memory cell by setting the selection signal line to a sufficient voltage for putting the memory cell in a selected condition, electric charges flowing into the at least one of the corresponding pair of data signal lines, because of factor other than the current caused due to the polarization of the ferroelectric capacitor, whereby a voltage not smaller than the coercive voltage of the ferroelectric capacitor can be applied between the opposing electrodes of the ferroelectric capacitor, the method performing the reading of data from said memory cell to be read out, by setting the corresponding data signal line connected to said memory cell to be read out, to a second voltage, by setting a plate line connected to said memory cell to be read out, to a third voltage which is different from said second voltage and also different from a fourth voltage before the data reading operation, by setting said selection signal line connected to said memory cell to be read out, to a fifth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line.

12. A method claimed in claim 11 wherein one end of a capacitor is connected to said data signal line, and the other end of said capacitor is connected to a control signal line, so that when data is read out from the memory cell, said control signal line is driven so as to suppress a voltage variation on said data signal line, whereby a voltage not smaller than the coercive voltage can be applied between the opposing electrodes of the ferroelectric capacitor.

13. A method claimed in claim 12 wherein said control signal line is driven in a voltage direction opposite to that of said plate line.

14. A method claimed in claim 12 wherein said control signal line is driven from said fourth voltage to said third voltage.

15. A method claimed in claim 12 wherein said capacitor is composed of at least one ferroelectric capacitor.

16. A method claimed in claim 11 wherein said data signal line is connected to one end of a capacitor through a first switch means controlled by a first control signal, and the other end of said capacitor is connected to receive a second control signal, and when data is read out from the memory cell, said switch means is closed by said first control signal and said second control signal is driven so as to suppress a voltage variation on said data signal line, whereby a voltage not smaller than the coercive Voltage can be applied between the opposing electrodes of the ferroelectric capacitor.

17. A method claimed in claim 16 wherein said control signal line is driven in a voltage direction opposite to that of said plate line.

18. A method claimed in claim 16 wherein said control signal line is driven from said fourth voltage to said third voltage.

19. A method claimed in claim 16 wherein said capacitor is composed of at least one ferroelectric capacitor.

20. A method claimed in claim 16 wherein a combination of said capacitor and said first switch means is composed of at least one memory cell.

21. A method claimed in claim 11 wherein said data signal line is connected to one end of a capacitor through a first switch means controlled by a first control signal, and the other end of said capacitor is connected to a fixed voltage, and when data is read out from the memory cell, said switch means is closed by said first control signal so that a current flows form said data signal line to a connection node between said capacitor and said switch means or form said connection node between said capacitor and said switch means to said data signal line, thereby to suppress a voltage variation on said data signal line, whereby a voltage not smaller than the coercive voltage can be applied between the opposing electrodes of the ferroelectric capacitor.

22. A method claimed in claim 21 wherein said capacitor is composed of at least one ferroelectric capacitor.

23. A method claimed in claim 21 wherein a combination of said capacitor and said first switch means is composed of at least one memory cell.

24. A method claimed in claim 11 wherein said data signal line is connected to a constant current source or a constant voltage source through a switch means controlled by a first control signal, and when data is read out from the memory cell, said switch means is closed by said first control signal so as to suppress a voltage variation on said data signal line, whereby a voltage not smaller than the coercive voltage can be applied between the opposing electrodes of the ferroelectric capacitor.

25. A method for controlling an operation of a ferroelectric memory which comprises, a plurality of pairs of data signal lines for outputting and receiving data, a plurality of selection signal lines selected in accordance with an address signal, and a plurality of unitary memory cell arrays each arranged along a corresponding one pair of data signal lines of said plurality of pairs of data signal lines, each of said unitary memory cell arrays including:

a plurality of memory cells each including a ferroelectric capacitor having a capacitor dielectric composed of a ferroelectric material and sandwiched between a pair of opposing electrodes, a switching means connected to said ferroelectric capacitor and one of said corresponding pair of data signal lines, and controlled by a corresponding one of said selection signal lines, so that different polarized conditions of said ferroelectric capacitor correspond to different conditions of stored data, respectively, and when a first voltage, which is not zero, is applied between the opposing electrodes of said ferroelectric capacitor, since a current flowing between said ferroelectric capacitor and the corresponding data signal line is different dependently upon the polarized condition of said ferroelectric capacitor, the current is detected or a voltage appearing on the corresponding pair of data signal lines due to the current is detected for the purpose of reading out the stored data;

a means connected to the corresponding one pair of data signal lines, for detecting a current or voltage difference appearing between the corresponding pair of data signal lines; and a means connected to at least one of the corresponding pair of data signal lines, for absorbing, when data is read out from a memory cell by setting the selection signal line to a sufficient voltage for putting the memory cell in a selected condition, electric charges flowing into the at least one of the corresponding pair of data signal lines, because of factor other than the current caused due to the polarization of the ferroelectric capacitor, whereby a voltage not smaller than the coercive voltage of the ferroelectric capacitor can be applied between the opposing electrodes of the ferroelectric capacitor, the method performing the reading of data from said memory cell to be read out, by setting the corresponding data signal line connected to said memory cell to be read out, to a second voltage, by setting a plate line connected to said memory cell to be read out, to a third voltage which is a fixed voltage different from said second voltage, by setting said selection signal line connected to said memory cell to be read out, to a fourth voltage for selecting said memory cell to be read out, so that a voltage difference is caused to occur between the opposing electrodes of said ferroelectric capacitor, whereby a signal corresponding to the data stored in said memory cell to be read out is outputted to the corresponding data signal line.

26. A method claimed in claim 25 wherein one end of a capacitor is connected to said data signal line, and the other end of said capacitor is connected to a control signal line, so that when data is read out from the memory cell, said control signal line is driven so as to suppress a voltage variation on said data signal line, whereby a voltage not smaller than the coercive voltage can be applied between the opposing electrodes of the ferroelectric capacitor.

27. A method claimed in claim 26 wherein said control signal line is driven in a voltage direction opposite to that of said plate line.

28. A method claimed in claim 26 wherein said control signal line is driven from said fourth voltage to said third voltage.

29. A method claimed in claim 26 wherein said capacitor is composed of at least one ferroelectric capacitor.

30. A method claimed in claim 25 wherein said data signal line is connected to one end of a capacitor through a first switch means controlled by a first control signal, and the other end of said capacitor is connected to receive a second control signal, and when data is read out from the memory cell, said switch means is closed by said first control signal and said second control signal is driven so as to suppress a voltage variation on said data signal line, whereby a voltage not smaller than the coercive voltage can be applied between the opposing electrodes of the ferroelectric capacitor.

31. A method claimed in claim 30 wherein said control signal line is driven in a voltage direction opposite to that of said plate line.

32. A method claimed in claim 30 wherein said control signal line is driven from said fourth voltage to said third voltage.

33. A method claimed in claim 30 wherein said capacitor is composed of at least one ferroelectric capacitor.

34. A method claimed in claim 30 wherein a combination of said capacitor and said first switch means is composed of at least one memory cell.

35. A method claimed in claim 25 wherein said data signal line is connected to one end of a capacitor through a first switch means controlled by a first control signal, and the other end of said capacitor is connected to a fixed voltage, and when data is read out from the memory cell, said switch means is closed by said first control signal so that a current flows form said data signal line to a connection node between said capacitor and said switch means or form said connection node between said capacitor and said switch means to said data signal line, thereby to suppress a voltage variation on said data signal line, whereby a voltage not smaller than the coercive voltage can be applied between the opposing electrodes of the ferroelectric capacitor.

36. A method claimed in claim 35 wherein said capacitor is composed of at least one ferroelectric capacitor.

37. A method claimed in claim 35 wherein a combination of said capacitor and said first switch means is composed of at least one memory cell.

38. A method claimed in claim 25 wherein said data signal line is connected to a constant current source or a constant voltage source through a switch means controlled by a first control signal, and when data is read out from the memory cell, said switch means is closed by said first control signal so as to suppress a voltage variation on said data signal line, whereby a voltage not smaller than the coercive voltage can be applied between the opposing electrodes of the ferroelectric capacitor.

* * * * *